(12) United States Patent
Kozuma et al.

(10) Patent No.: US 12,040,653 B2
(45) Date of Patent: Jul. 16, 2024

(54) CHARGE CONTROL CIRCUIT AND ABNORMALITY DETECTION SYSTEM OF SECONDARY BATTERY

(71) Applicant: SEMICONDUCTOR ENERGY LABORATORY CO., LTD., Atsugi (JP)

(72) Inventors: Munehiro Kozuma, Kanagawa (JP); Takayuki Ikeda, Kanagawa (JP); Takanori Matsuzaki, Kanagawa (JP); Kei Takahashi, Kanagawa (JP); Mayumi Mikami, Kanagawa (JP); Shunpei Yamazaki, Tokyo (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 455 days.

(21) Appl. No.: 17/283,689

(22) PCT Filed: Oct. 15, 2019

(86) PCT No.: PCT/IB2019/058757
§ 371 (c)(1),
(2) Date: Apr. 8, 2021

(87) PCT Pub. No.: WO2020/084386
PCT Pub. Date: Apr. 30, 2020

(65) Prior Publication Data
US 2021/0384753 A1 Dec. 9, 2021

(30) Foreign Application Priority Data

Oct. 25, 2018 (JP) ................................ 2018-200636
Oct. 25, 2018 (JP) ................................ 2018-200638

(51) Int. Cl.
*H02J 7/00* (2006.01)
*G11C 11/401* (2006.01)
(Continued)

(52) U.S. Cl.
CPC ...... *H02J 7/007194* (2020.01); *G11C 11/401* (2013.01); *H01M 10/0525* (2013.01);
(Continued)

(58) Field of Classification Search
CPC .. H02J 7/007194; H02J 7/0029; H02J 7/0047; H02J 2310/48; H02J 7/00309;
(Continued)

(56) References Cited

U.S. PATENT DOCUMENTS 3,579,076 A * 5/1971 Herbst .................... H02J 7/02
320/134
5,900,717 A 5/1999 Lee
(Continued)

FOREIGN PATENT DOCUMENTS

CN 102326289 A 1/2012
CN 102473982 A 5/2012
(Continued)

OTHER PUBLICATIONS

International Search Report (Application No. PCT/IB2019/058757) dated Dec. 17, 2019.
(Continued)

*Primary Examiner* — Stacy Whitmore
(74) *Attorney, Agent, or Firm* — NIXON PEABODY LLP; Jeffrey L. Costellia

(57) ABSTRACT

The safety is ensured in such a manner that with an abnormality detection system of a secondary battery, abnormality of a secondary battery is detected, for example, a phenomenon that lowers the safety of the secondary battery is detected early, and a user is warned or the use of the
(Continued)

secondary battery is stopped. The abnormality detection system of the secondary battery determines whether the temperature of the secondary battery is within a temperature range in which normal operation can be performed on the basis of temperature data obtained with a temperature sensor. In the case where the temperature of the secondary battery is high, a cooling device is driven by a control signal from the abnormality detection system of the secondary battery. The abnormality detection system of the secondary battery includes at least a memory means. The memory means has a function of holding an analog signal and includes a transistor using an oxide semiconductor for a semiconductor layer.

6 Claims, 12 Drawing Sheets

(51) Int. Cl.
  *H01L 27/06* (2006.01)
  *H01M 10/0525* (2010.01)
  *H01M 10/42* (2006.01)
  *H01M 10/48* (2006.01)
  *H01M 10/613* (2014.01)
  *H01M 10/615* (2014.01)
  *H01M 10/625* (2014.01)
  *H01M 10/633* (2014.01)

(52) U.S. Cl.
  CPC ..... *H01M 10/425* (2013.01); *H01M 10/4257* (2013.01); *H01M 10/48* (2013.01); *H01M 10/486* (2013.01); *H01M 10/613* (2015.04); *H01M 10/615* (2015.04); *H01M 10/625* (2015.04); *H01M 10/633* (2015.04); *H02J 7/0029* (2013.01); *H02J 7/0047* (2013.01); *H01L 27/0629* (2013.01); *H01M 2010/4271* (2013.01); *H01M 2220/20* (2013.01)

(58) Field of Classification Search
  CPC . H02J 7/0031; G11C 11/401; H01M 10/0525; H01M 10/425; H01M 10/4257; H01M 10/48; H01M 10/486; H01M 10/613; H01M 10/615; H01M 10/625; H01M 10/633; H01M 2010/4271; H01M 2220/20; H01M 10/482; H01M 10/6568; H01M 10/443; H01M 10/637; H01L 27/0629; H01L 21/8258; H01L 27/0688; H01L 27/1225; H01L 29/78648; H01L 29/7869; H01L 29/78696; Y02E 60/10; Y02T 10/70; B60L 58/24; C01B 11/00
  See application file for complete search history.

(56) References Cited

U.S. PATENT DOCUMENTS

| | | | |
|---|---|---|---|
| 5,909,101 A | 6/1999 | Matsumoto et al. | |
| 8,093,867 B2 | 1/2012 | Sato et al. | |
| 8,643,341 B2 | 2/2014 | Hamaguchi et al. | |
| 8,860,376 B2 | 10/2014 | Kimura et al. | |
| 9,231,425 B2 | 1/2016 | Lee et al. | |
| 9,310,866 B2 | 4/2016 | Koyama et al. | |
| 9,537,193 B2 * | 1/2017 | Ogawa | H01M 10/399 |
| 9,614,258 B2 | 4/2017 | Takahashi et al. | |
| 10,298,043 B2 | 5/2019 | Takahashi et al. | |
| 10,476,289 B2 | 11/2019 | Takahashi et al. | |
| 2005/0156566 A1* | 7/2005 | Thorsoe | H02J 7/00309 320/116 |
| 2006/0076926 A1* | 4/2006 | Lee | H02J 7/0031 320/112 |
| 2007/0152639 A1* | 7/2007 | Miller | H02J 7/007194 320/150 |
| 2010/0176768 A1 | 7/2010 | Kimura et al. | |
| 2011/0059337 A1* | 3/2011 | Yoshida | H01M 10/48 429/7 |
| 2012/0105010 A1 | 5/2012 | Kinoshita | |
| 2012/0293021 A1* | 11/2012 | Teggatz | H02J 7/007192 307/151 |
| 2012/0327596 A1* | 12/2012 | Anderson-Straley | H01M 10/625 361/689 |
| 2013/0162197 A1 | 6/2013 | Takahashi et al. | |
| 2017/0324118 A1* | 11/2017 | Ishishita | H01M 10/443 |
| 2018/0262024 A1* | 9/2018 | Raikar | H02J 7/007194 |
| 2020/0052499 A1 | 2/2020 | Takahashi et al. | |

FOREIGN PATENT DOCUMENTS

| | | |
|---|---|---|
| CN | 103178308 A | 6/2013 |
| CN | 204558622 U | 8/2015 |
| CN | 107539137 A | 1/2018 |
| CN | 108357367 A | 8/2018 |
| DE | 19712515 | 10/1997 |
| EP | 2518817 A | 10/2012 |
| JP | 2001-128382 A | 5/2001 |
| JP | 2001-160622 A | 6/2001 |
| JP | 2008-284947 A | 11/2008 |
| JP | 2009043554 A * | 2/2009 |
| JP | 2010-066161 A | 3/2010 |
| JP | 2010-086774 A | 4/2010 |
| JP | 2010-124688 A | 6/2010 |
| JP | 2011-095087 A | 5/2011 |
| JP | 2012-009418 A | 1/2012 |
| JP | 2012-196137 A | 10/2012 |
| JP | 2012-230040 A | 11/2012 |
| JP | 2013-149609 A | 8/2013 |
| JP | 2014-143190 A | 8/2014 |
| JP | 2016-154110 A | 8/2016 |
| JP | 2017-184352 A | 10/2017 |
| JP | 2017-204483 A | 11/2017 |
| JP | 2017-213993 A | 12/2017 |
| JP | 2018-142544 A | 9/2018 |
| JP | 2018-151443 A | 9/2018 |
| KR | 2009-0122305 A | 11/2009 |
| KR | 2011-0088270 A | 8/2011 |
| KR | 2013-0073830 A | 7/2013 |
| KR | 2014-0091624 A | 7/2014 |
| WO | WO-2009/005097 | 1/2009 |
| WO | WO-2014/104266 | 7/2014 |

OTHER PUBLICATIONS

Written Opinion (Application No. PCT/IB2019/058757) dated Dec. 17, 2019.
Deng.W et al., "A Core Compact Model for IGZO TFTs Considering Degeneration Mechanism", IEEE Transactions on Electron Devices, Feb. 13, 2018, vol. 65, No. 4, pp. 1370-1376.
Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
Ito.S et al., "Analysis of Nanoscale Crystalline Structure of In—Ga—Zn—O Thin Film with Nano Beam Electron Diffraction", AM-FPD '13 Digest of Technical Papers, Jul. 2, 2013, pp. 151-154.
Yamazaki.S et al., "In—Ga—Zn-Oxide Semiconductor and its Transistor Characteristics", ECS Journal of Solid State Science and Technology, Jul. 1, 2014, vol. 3, No. 9, pp. Q3012-Q3022.
Yamazaki.S, "Crystalline Oxide Semiconductor Using CAAC-IGZO and its Application", ECS Transactions, Oct. 1, 2014, vol. 64, No. 10, pp. 155-164, The Electrochemical Society.
Kato.K et al., "Evaluation of Off-State Current Characteristics of Transistor Using Oxide Semiconductor Material, Indium-Gallium-

(56) References Cited

OTHER PUBLICATIONS

Zinc Oxide", Jpn. J. Appl. Phys. (Japanese Journal of Applied Physics), 2012, vol. 51, pp. 021201-1-021201-7.

Matsuda.S et al., "30-nm-Channel-Length C-Axis Aligned Crystalline In—Ga—Zn—O Transistors with Low Off-State Leakage Current and Steep Subthreshold Characteristics", 2015 Symposium on VLSI Technology : Digest of Technical Papers, 2015, pp. T216-T217.

Amano.S et al., "Low Power LC Display Using In—Ga—Zn-Oxide TFTs Based on Variable Frame Frequency", SID Digest '10 : SID International Symposium Digest of Technical Papers, May 23, 2010, vol. 41, No. 1, pp. 626-629.

Chinese Office Action (Application No. 201980068261.8) dated Mar. 5, 2024.

\* cited by examiner

410

420

430

440

450

460

470

In charging

CHARGE CONTROL CIRCUIT AND ABNORMALITY DETECTION SYSTEM OF SECONDARY BATTERY

TECHNICAL FIELD

One embodiment of the present invention relates to an object, a method, or a manufacturing method. Alternatively, the present invention relates to a process, a machine, manufacture, or a composition (composition of matter). One embodiment of the present invention relates to a semiconductor device, a display device, a light-emitting device, a power storage device, a lighting device, an electronic device, or a manufacturing method thereof. One embodiment of the present invention relates to a vehicle or an electronic device for vehicles provided in a vehicle. In particular, one embodiment of the present invention relates to a charge control circuit of a secondary battery, a charge control method of a secondary battery, an abnormality detection system of a secondary battery, and an electronic device including a secondary battery.

Note that in this specification, a power storage device refers to every element and device having a function of storing power. Examples of the power storage device include a secondary battery such as a lithium-ion secondary battery, a lithium-ion capacitor, an all-solid-state battery, and an electric double layer capacitor.

BACKGROUND ART

In recent years, a variety of power storage devices such as lithium-ion secondary batteries, lithium-ion capacitors, and air batteries have been actively developed. In particular, demand for lithium-ion secondary batteries with high output and high energy density has rapidly grown with the development of the semiconductor industry, for portable information terminals such as mobile phones, smartphones, tablets, and notebook computers; portable music players; digital cameras; medical equipment; next-generation clean energy vehicles such as hybrid electric vehicles (HEV), electric vehicles (EV), and plug-in hybrid electric vehicles (PHEV); and the like. The lithium-ion secondary batteries are essential as rechargeable energy supply sources for today's information society.

In a portable information terminal, an electric vehicle, or the like, a plurality of secondary batteries connected in series or in parallel and provided with a protection circuit are used as a battery pack (also referred to as an assembled battery). Note that a battery pack means a container (a metal can or a film exterior body) in which a plurality of secondary batteries and a predetermined circuit are stored for easy handling of secondary batteries. The battery pack has an ECU (Electronic Control Unit) in order to manage the operation state.

Electric vehicles are vehicles in which only an electric motor is used for a driving portion, and there are also hybrid vehicles having both an internal-combustion engine such as an engine and an electric motor. A plurality of secondary batteries used in vehicles are provided as a battery pack, and a plurality of the battery packs are provided on the lower portion of a vehicle.

The secondary battery used in an electric vehicle or a hybrid vehicle degrades depending on the number of charging, the depth of discharge, charging currents, charging environment (a change in ambient temperature), or the like. The degradation also depends on the usage of a user, and ambient temperatures at the time of charging, frequency of fast charging, charging amount from regenerative braking, charging timing with a regenerative brake, and the like might be related to the degradation.

Patent Document 1 describes that the state of a secondary battery, such as the remaining battery power, voltage, current, or temperature can be measured by a sensor.

REFERENCE

Patent Document

[Patent Document 1] Japanese Published Patent Application No. 2014-143190

SUMMARY OF THE INVENTION

Problems to be Solved by the Invention

The temperature in an electric vehicle depends on the operation state or environment and is easily changed; thus, safety measures for temperature are required. Among components mounted on an electric vehicle, a secondary battery is a power source of the electric vehicle and fulfills the most important function. However, there is a problem in that the temperature range in which a secondary battery using lithium can operate normally (higher than or equal to $-20°$ C. and lower than or equal to $60°$ C.) is narrower than the allowable range of the ambient temperature in which an electric vehicle is used (higher than or equal to $-50°$ C. and lower than or equal to $100°$ C.).

If the ambient temperature is out of the normal range, charge and discharge performance and lifetime of a secondary battery might be greatly affected; thus, the secondary battery is desirably used at a constant ambient temperature as much as possible. The temperature of the secondary battery is increased not only by the ambient environment problem but also by a flow of a large amount of current due to charging and discharging.

The degradation of a secondary battery is likely to proceed by an inner chemical reaction in the state of high ambient temperature, which is a problem. Moreover, there is a problem in that in an extremely cold area where the ambient temperature reaches as low as $-50°$ C., a liquid component in a secondary battery freezes and thus discharge is not caused, losing a function of a secondary battery.

Without limitation to an extremely cold area, the capacity of a lithium-ion secondary battery is reduced when the ambient temperature at which an electric vehicle is used is low, and a lower temperature increases inner resistance and reduces output voltage. Furthermore, when charging is performed at a low ambient temperature, electrodeposition of a lithium metal is caused, leading to sudden degradation.

Thus, an object is to ensure safety in such a manner that, with an abnormality detection system of a secondary battery, abnormality of a secondary battery is detected, for example, a phenomenon that lowers the safety of the secondary battery is detected early, and a user is warned or the use of the secondary battery is stopped.

An electric vehicle with a secondary battery is required to let a driver (or a passenger) know the distance through which the electric vehicle can drive and to precisely estimate, on a real-time basis, the distance through which the electric vehicle can drive on the basis of information on the remaining capacity of the secondary battery. Abnormality of a secondary battery which might stop a function of the secondary battery suddenly occurs in some cases, though it does not occur many times, and it is difficult to predict the abnormality in conventional ways. One embodiment of the present invention provides a control system of a secondary battery which calculates the remaining capacity and the internal resistance of the secondary battery on an electric vehicle, warns of the secondary battery with abnormal characteristics, stops using the secondary battery, changes the secondary battery, or changes charging conditions.

An object of one embodiment of the present invention is to provide a novel battery control circuit, a novel power storage device, a novel electronic device, and the like.

Means for Solving the Problems

An abnormality detection system of a secondary battery determines, on the basis of temperature data obtained with a temperature sensor, whether the temperature of the secondary battery is within a temperature range in which normal operation can be performed and reports the result to a user. In the case where the temperature of the secondary battery is high, a cooling device is driven by a control signal from the abnormality detection system of the secondary battery. In the case where the temperature of the secondary battery is high, a user is notified with a warning alarm that danger of occurrence of system abnormality of the electric vehicle is approaching. In the case where the temperature of the secondary battery is low, a heating device is driven to increase the temperature of the secondary battery before the temperature further decreases and the secondary battery freezes.

The abnormality detection system of the secondary battery includes at least a memory means, and the memory means has a function of holding an analog signal and includes a transistor using an oxide semiconductor for a semiconductor layer. The transistor using an oxide semiconductor for a semiconductor layer enables the abnormality detection system to reduce its power consumption.

A charge control circuit of a secondary battery disclosed in this specification includes a temperature sensor for sensing a temperature of the secondary battery; first and second temperature comparison circuits provided with an analog signal from the temperature sensor to generate a pulse signal; a heating device of the secondary battery which operates in two temperature ranges set by the first temperature comparison circuit; and a cooling device of the secondary battery which operates in two temperature ranges set by the second temperature comparison circuit.

In the above structure, the first temperature comparison circuit or the second temperature comparison circuit includes a comparator having two threshold values.

In the above structure, the charge control circuit of the secondary battery controls turning on and off of a switch for interrupting current for charging the secondary battery.

In the above structure, the charge control circuit of the secondary battery includes at least a memory means, and the memory means has a function of holding an analog signal and includes a transistor using an oxide semiconductor for a semiconductor layer.

As another structure of the invention, a charge control circuit of a secondary battery disclosed in this specification includes a temperature sensor for sensing a temperature of the secondary battery, a temperature comparison circuit provided with an analog signal from the temperature sensor to generate a pulse signal, an audio device that operates in a temperature range set by the temperature comparison circuit, and a memory means. The temperature comparison circuit includes a comparator having two threshold values. The memory means has a function of holding an analog signal and includes a transistor using an oxide semiconductor for a semiconductor layer.

In each of the above structures, the charge control circuit of the secondary battery is provided over a printed circuit board.

A disclosed structure of an abnormality detection system of a secondary battery includes the step of setting, by a charge control circuit, a temperature control device of the secondary battery to operate only in a given temperature range; the step of charging the secondary battery by turning off a switch for interrupting current for charging the secondary battery; the step of sensing a temperature of the secondary battery with a temperature sensor; the step of stopping charging by turning on the switch for interrupting current for charging the secondary battery when the temperature of the secondary battery reaches the upper limit of the set temperature range; and the step of driving the temperature control device to lower the temperature of the secondary battery so that the temperature of the secondary battery falls within the set temperature range, i.e., the temperature is lower than the upper limit temperature.

A disclosed structure of an abnormality detection system of a secondary battery includes the step of setting, by a charge control circuit, a temperature control device of the secondary battery to operate only in a given temperature range; the step of sensing a temperature of the secondary battery with a temperature sensor, and the step of starting an audio device to give a warning alarm when the temperature of the secondary battery is out of the set temperature range (a temperature lower than or equal to the lower limit temperature or higher than or equal to the upper limit temperature).

In the above structure, the temperature range in which the warning alarm is given is from 45° C. to 60° C. inclusive or from −50° C. to 10° C. inclusive.

The above temperature range is not a temperature outside an electric vehicle or the like but a temperature around an exterior body of the secondary battery. The exterior body (including a laminate film and a sealing can) is formed of a material with good beat dissipation in many cases; in the case where the thickness of the exterior body is as thin as 1 mm or less, the temperature of a surface of the exterior body can be regarded as being almost the same as the temperature inside the secondary battery. Depending on the inner structure of the secondary battery, arrangement of lead lines, or a sealing method, there might be a portion in which the temperature is likely to locally increase. It is preferable that the temperature sensor of the secondary battery be provided in a portion whose temperature is likely to increase.

Another disclosed structure of an abnormality detection system of a secondary battery includes the step of setting, by a charge control circuit, a temperature control device of the secondary battery to operate only in a given temperature range; the step of charging the secondary battery by turning off a switch for interrupting current for charging the secondary battery; the step of sensing a temperature of the secondary battery with a temperature sensor; the step of stopping charging by turning on the switch for interrupting current for charging the secondary battery when the temperature of the secondary battery reaches the lower limit of the set temperature range; and the step of driving the temperature control device to increase the temperature of the secondary battery so that the temperature of the secondary battery falls within the set temperature range, i.e., the temperature is higher than the lower limit temperature.

Effect of the Invention

With the abnormality detection system of a secondary battery disclosed in this specification, abnormality of the secondary battery is detected, for example, a phenomenon that lowers the safety of the secondary battery is predicted, and a user is warned or operating conditions of the secondary battery are changed; thus, the safety is ensured.

With the abnormality detection system of a secondary battery disclosed in this specification, temperature abnormality of the secondary battery is detected and a user is warned to be cautious; thus, a grave situation can be avoided.

With the abnormality detection system of a secondary battery disclosed in this specification, the temperature range in which normal operation can be performed in the environment where an electric vehicle is used can be widened.

MODE FOR CARRYING OUT THE INVENTION

Embodiments of the present invention are described in detail with reference to the drawings. Note that the present invention is not limited to the following description, and it is readily understood by those skilled in the art that modes and details of the present invention can be modified in various ways. In addition, the present invention should not be construed as being limited to the description of embodiments below.

Embodiment 1

Figure 1:
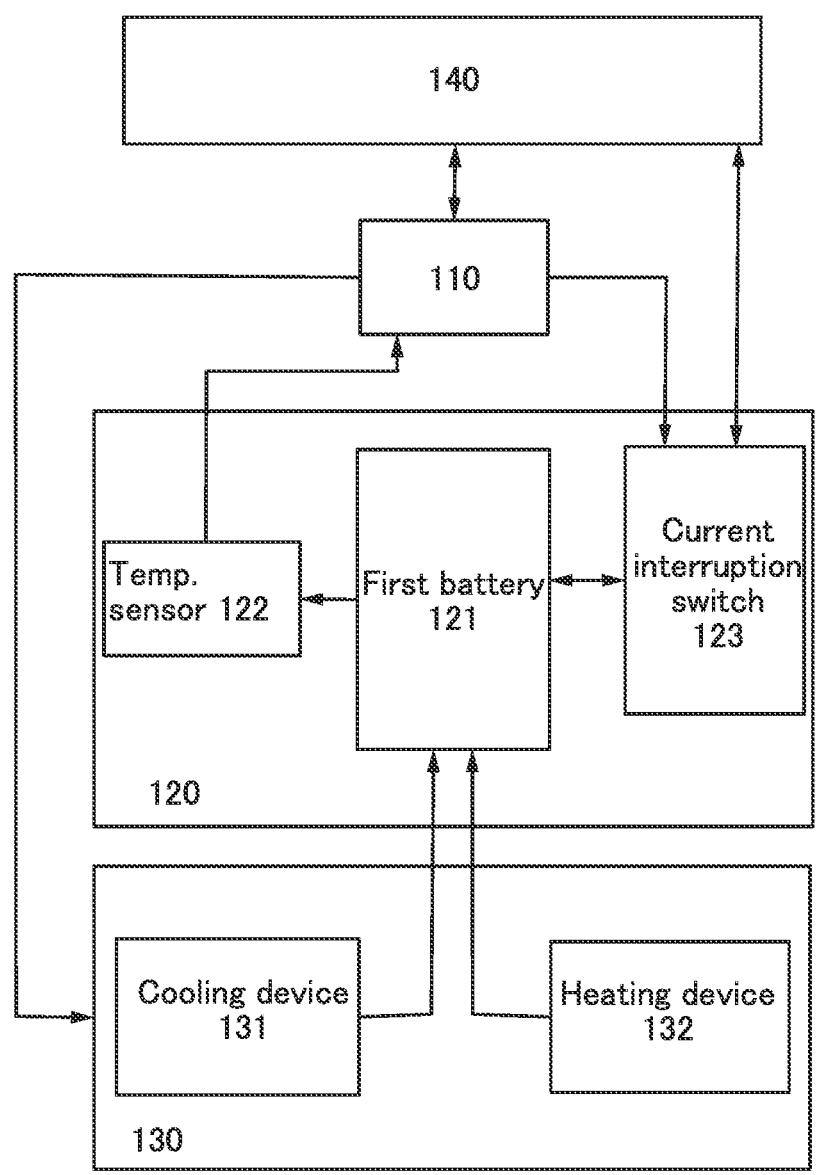
FIG. 1 is a block diagram illustrating one embodiment of the present invention.

FIG. 1 is an overall block diagram of an abnormality detection system of a secondary battery (hereinafter also referred to as a battery) whose temperature is to be controlled, BTOS (Battery operating system or Battery oxide semiconductor) (BMS: battery management system).

In FIG. 1, a vehicle 140 is a portion other than the abnormality detection system of the electric vehicle and includes a control circuit other than a charge control circuit, an air conditioning system, and the like.

An abnormality detection system 110 includes at least a charge control circuit and a memory means.

A temperature of a first battery 121 is measured by a temperature sensor 122 and the temperature is controlled by the abnormality detection system 110. When the temperature increases and is likely to exceed an allowable range in charging, a control signal is input to a current interruption switch 123 from the abnormality detection system 110 and charging is stopped. When the temperature increases and is likely to exceed the allowable range, a command signal is input to a cooling device 131 from the abnormality detection system 110 and the temperature of the first battery 121 is lowered. When the temperature lowers and is likely to fall out of the allowable range, a command signal is input to a heating device 132 from the abnormality detection system 110 and the temperature of the first battery 121 is increased. A temperature control device 130 of the secondary battery includes the cooling device 131 and the heating device 132.

Note that the abnormality detection system 110 specifically refers to a group of a plurality of ICs (e.g., CPUs) provided over a printed circuit board, for example.

The abnormality detection system 110 controls the temperature of the first battery by analog signal processing or digital signal processing.

Figure 2A:
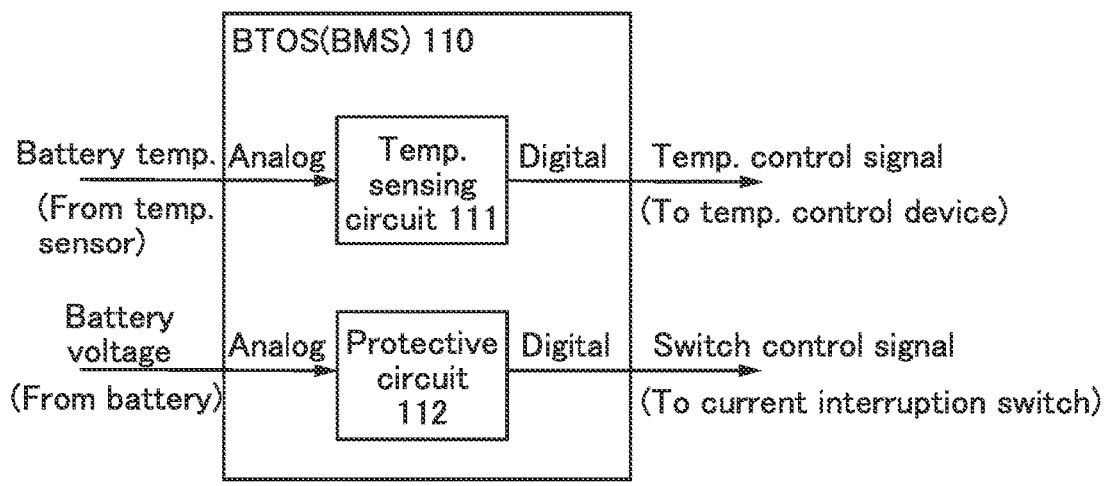
FIG. 2A and FIG. 2B are block diagrams illustrating embodiments of the present invention.

In the case where temperature sensing is performed by analog signal processing, a temperature sensing circuit 111 can sense a temperature state of the battery using an output signal (temperature information) of the temperature sensor that is an analog signal as it is, as illustrated in FIG. 2A. The temperature data of the battery is input from the temperature sensor to the abnormality detection system 110 as analog data and output to the temperature control device as a temperature control signal of a digital signal.

Figure 6A:
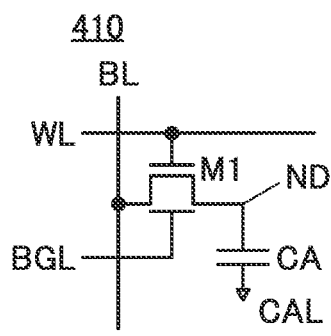
FIG. 6A, FIG. 6B, FIG. 6C, FIG. 6D, FIG. 6E, FIG. 6F, and FIG. 6G illustrate examples of memory circuit structures.
Figure 6B:
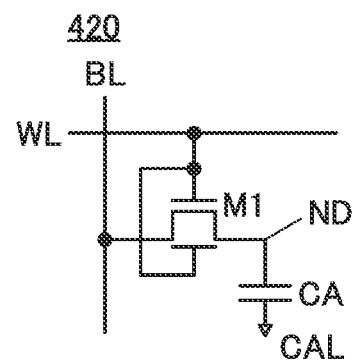
Figure 6C:
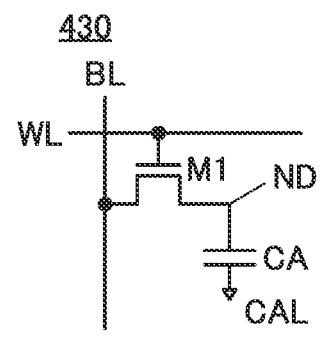

The temperature sensor 122 can employ temperature sensing using a circuit including a memory element 430 illustrated in FIG. 6C, for example. An oxide semiconductor tends to decrease in resistance in nature when the temperature rises. By utilizing this nature, it is possible to convert the ambient temperature into potential. In the case where the memory element 430 illustrated in FIG. 6C is used, a transistor M1 is turned on first to supply 0 V to a wiring BL and 0 V is written to a node ND. Next, VDD is supplied to the wiring BL and the transistor M1 is turned off after a certain period. An oxide semiconductor changes in resistance depending on the temperature. Thus, potential that corresponds to the ambient temperature at the time of measurement (also referred to as "ambient temperature information") is retained at the node ND. As the ambient temperature rises, the potential retained at the node ND becomes higher.

In the above-described manner, the memory element 430 can function as a temperature sensor.

Not the memory element 430 but a thermistor that exhibits temperature-dependent characteristics can be used for the temperature sensor 122. As the thermistor, an NTC (Negative Temperature Coefficient) thermistor, a PTC (Positive Temperature Coefficient) thermistor, or the like can be used.

A battery voltage input to a protective circuit 112 is supplied as analog potential, and an abnormal behavior such as overcharge, overdischarge, overcharge current, or overdischarge current is monitored using a comparator, for example. In the case of detecting an abnormal behavior, a switch control signal serves as logic for turning off a power interruption switch (bringing a power interruption switch into an off state).

Figure 2B:
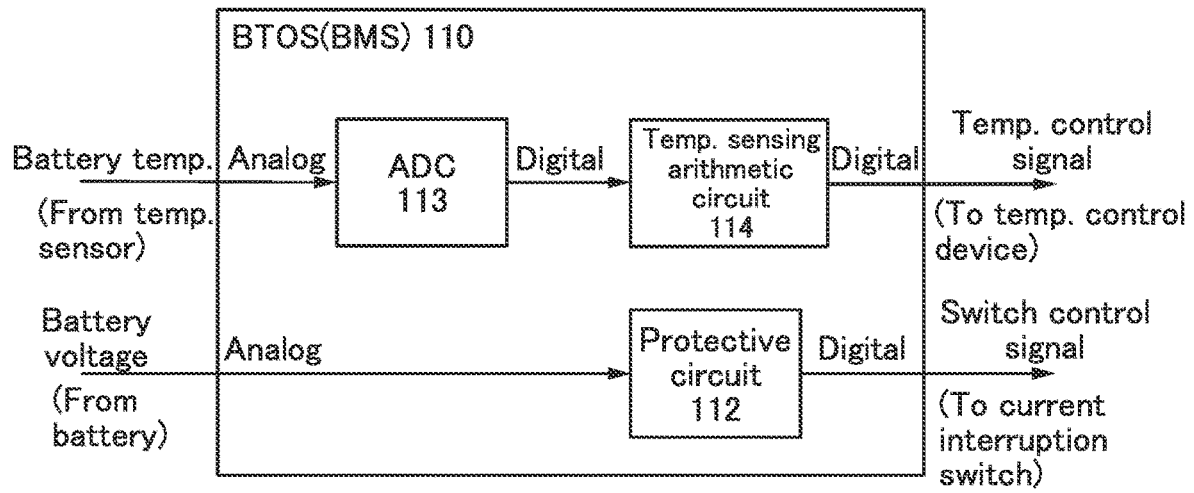

In the case where temperature sensing is performed by digital signal processing, an ADC 113 converts the battery temperature (analog signal) into a digital signal and outputs the digital signal, as illustrated in FIG. 2B. A temperature sensing arithmetic circuit 114 generates a control signal for driving the temperature control device 130 by calculating (identifying and detecting) an input digital signal and outputs the control signal. For example, when a pulse signal for precise on-off control of the temperature control device is generated as the temperature control signal, the battery temperature can be finely adjusted or intermittently controlled. A micro can be used as the temperature sensing arithmetic circuit 114, for example. Note that a micro refers to a microcomputer or a microprocessor to which program capable of executing an algorithm such as arithmetic operation is ported.

Figure 3:
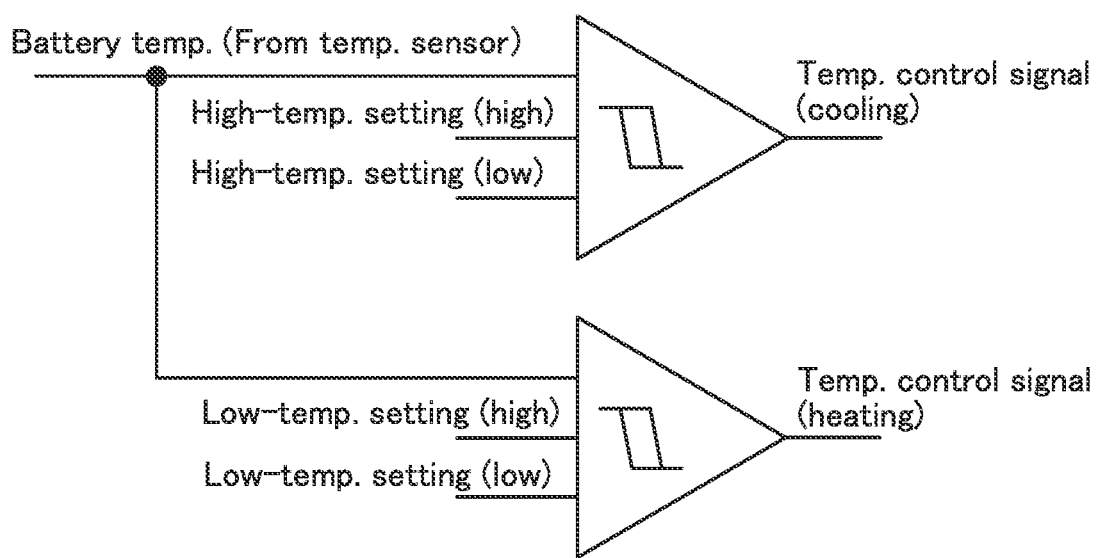
FIG. 3 is a block diagram illustrating one embodiment of the present invention.

For example, the temperature sensing 111 can generate a pulse signal for on-off control by using hysteresis comparators such as those illustrated in FIG. 3. A hysteresis comparator has two threshold values for potential comparison. As potentials of high-temperature setting (high), high-temperature setting (low), low-temperature setting (high), and low-temperature setting (low), potentials corresponding to the respective temperatures may be supplied from the outside. A structure may also be employed in which each potential is held in a memory circuit including a transistor using an oxide semiconductor and a capacitor and a potential is not always supplied from the outside. FIG. 6 illustrates structure examples of such a memory circuit. A circuit including this memory circuit or the abnormality detection system 110 is referred to as a BTOS (Battery operating system or Battery oxide semiconductor) or a BMS (battery management system) in some cases.

As temperature control operation, when the potential of the battery temperature falls below the low-temperature setting (low), a temperature control signal (heating) that is an output of the hysteresis comparator is output as an ON signal. After that, when the potential of the battery temperature exceeds the low-temperature setting (high) by heating, the temperature control signal (heating) that is an output of the hysteresis comparator is output as an OFF signal.

For a specific example, when the threshold values are set such that the low-temperature setting (low) is set to 0° C., at which heating is on, and the low-temperature setting (high) is set to 5° C., at which heating is off, operation is not always performed and temperature control operation can be performed only at the time of need, enabling power-saving driving.

With the abnormality detection system of a battery disclosed in this specification, the temperature range in which normal operation can be performed with respect to the environment where an electric vehicle is used can be widened. Even when the ambient temperature changes, the temperature of the battery is controlled by the abnormality detection system of the battery and thus the electric vehicle can be driven normally.

Embodiment 2

Figure 4A:
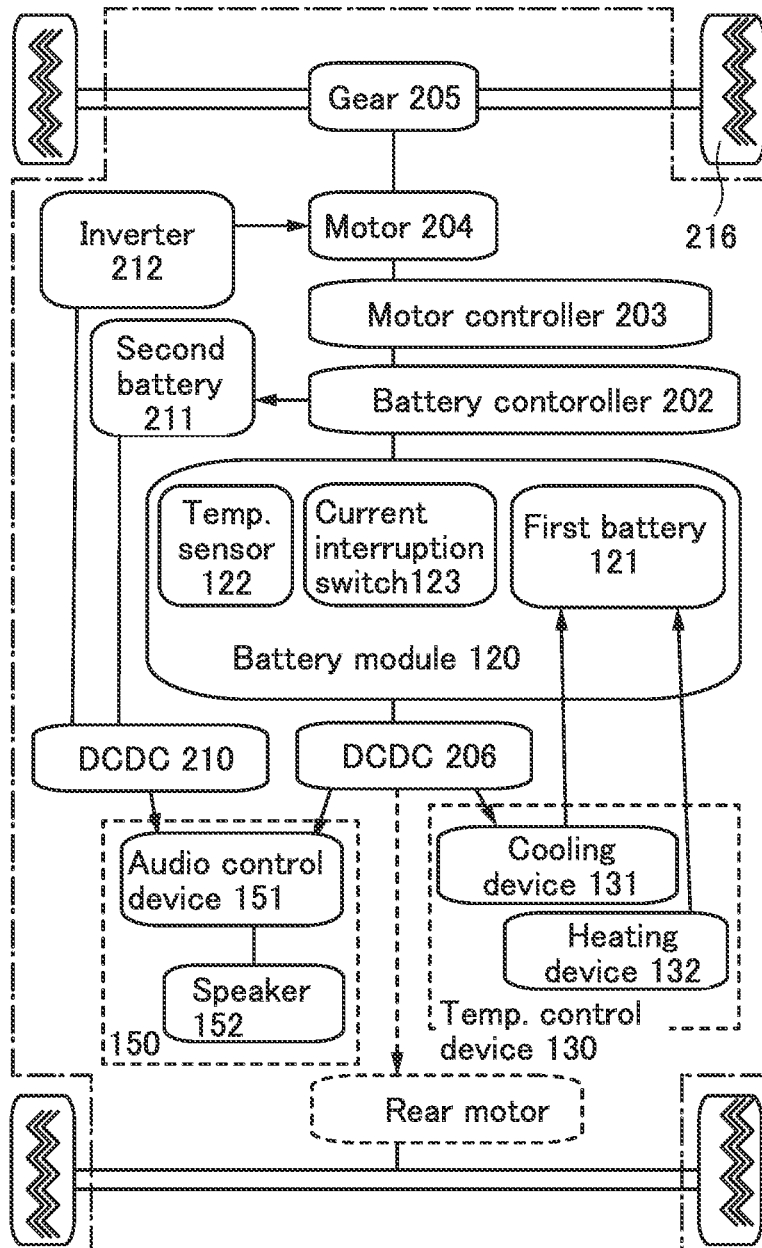
FIG. 4A is a block diagram of an electric vehicle of one embodiment of the present invention.

In this embodiment, an example in which the present invention is applied to an electric vehicle (EV) is described using FIG. 4A.

In the electric vehicle, the first battery 121 as a secondary battery for main driving and a second battery 211 which supplies electric power to an inverter 212 starting a motor 204 are provided. In this embodiment, a battery controller 202 monitors a battery module 120 including at least the temperature sensor 122, the current interruption switch 123, and the first battery 121. The battery module 120 is referred to as a battery pack in some cases.

The first battery 121 supplies electric power mainly to in-vehicle parts for 42 V (for a high-voltage system) and the second battery 211 supplies electric power to in-vehicle parts for 14 V (for a low-voltage system). Lead batteries are usually used for the second battery 211 due to cost advantage. Lead batteries have disadvantages compared with lithium-ion secondary batteries in that they have a larger amount of self-discharge and are more likely to degrade due to a phenomenon called sulfation. An advantage of using a lithium-ion secondary battery for the second battery 211 is eliminating the need for maintenance; however, if it is used over a long time, for example three years or longer, abnormalities that cannot be determined at the time of manufacturing the battery may occur. In particular, when the second battery 211 that starts the inverter becomes inoperative, the motor cannot be started even when the first battery 121 has remaining capacity; thus, in order to prevent this, in the case where the second battery 211 is a lead battery, the second battery is supplied with electric power from the first battery to constantly maintain a fully-charged state.

In this embodiment, an example in which a lithium-ion secondary battery is used for the first battery 121 is described. A lead battery or an all-solid-state battery is used for the second battery 211.

Figure 12A:
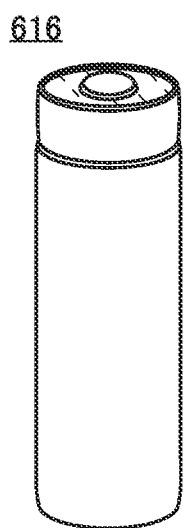
FIG. 12A and FIG. 12B are perspective views illustrating an example of a secondary battery.
Figure 12B:
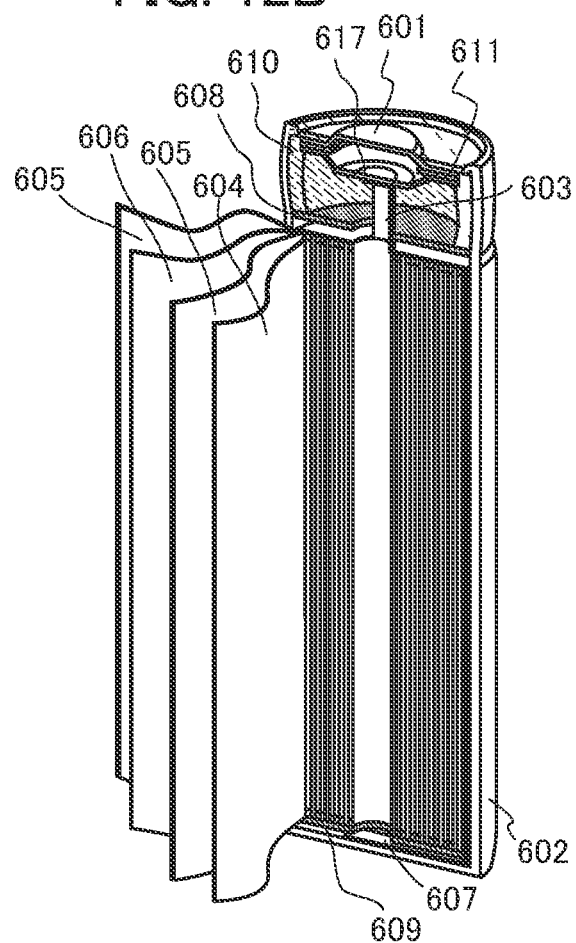

An example of a cylindrical secondary battery is described with reference to FIG. 12A and FIG. 12B. A cylindrical secondary battery 616 includes, as illustrated in FIG. 12B, a positive electrode cap (battery lid) 601 on the top surface and a battery can (outer can) 602 on the side and bottom surfaces. The positive electrode cap and the battery can (outer can) 602 are insulated by a gasket (insulating packing) 610.

FIG. 12B illustrates a schematic cross-sectional view of the cylindrical secondary battery. Inside the battery can 602 having a hollow cylindrical shape, a battery element in which a belt-like positive electrode 604 and a belt-like negative electrode 606 are wound with a separator 605 located therebetween is provided. Although not illustrated, the battery element is wound around a center pin. One end of the battery can 602 is closed and the other end thereof is opened. For the battery can 602, a metal having corrosion resistance to an electrolyte solution, such as nickel, aluminum, or titanium, an alloy of such a metal, or an alloy of such a metal and another metal (e.g., stainless steel or the like) can be used. The battery can 602 is preferably covered with nickel, aluminum, or the like to prevent corrosion due to an electrolyte solution. Inside the battery can 602, the battery element in which the positive electrode, the negative electrode, and the separator are wound is interposed between a pair of insulating plates 608 and 609 that face each other. Furthermore, a nonaqueous electrolyte solution (not illustrated) is injected inside the battery can 602 provided with the battery element. The secondary battery is composed of a positive electrode containing an active material such as lithium cobalt oxide ($LiCoO_2$) or lithium iron phosphate ($LiFePO_4$), a negative electrode composed of a carbon material such as graphite capable of occluding and releasing lithium ions, a nonaqueous electrolytic solution in which an electrolyte composed of a lithium salt such as $LiBF_4$ or $LiPF_6$ is dissolved in an organic solvent such as ethylene carbonate or diethyl carbonate, and the like.

Since the positive electrode and the negative electrode of the cylindrical secondary battery are wound, active materials are preferably formed on both sides of current collectors. A positive electrode terminal (positive electrode current collector lead) 603 is connected to the positive electrode 604, and a negative electrode terminal (negative electrode current collector lead) 607 is connected to the negative electrode 606. For both the positive electrode terminal 603 and the negative electrode terminal 607, a metal material such as aluminum can be used. The positive electrode terminal 603 and the negative electrode terminal 607 are resistance-welded to a safety valve mechanism 617 and the bottom of the battery can 602, respectively. The safety valve mechanism 617 is electrically connected to the positive electrode cap 601 through a PTC (Positive Temperature Coefficient) element 611. The safety valve mechanism 617 cuts off the electrical connection between the positive electrode cap 601 and the positive electrode 604 when the increased internal pressure of the battery exceeds a predetermined threshold value. In addition, the PTC element 611 is a thermally sensitive resistor whose resistance increases in the case where temperature rises, and limits the amount of current by increasing the resistance to prevent abnormal heat generation. Barium titanate ($BaTiO_3$)-based semiconductor ceramic or the like can be used for the PTC element.

A lithium-ion secondary battery using an electrolyte solution includes a positive electrode, a negative electrode, a separator, an electrolyte solution, and an exterior body. Note that in a lithium-ion secondary battery, the anode and the cathode are interchanged in charging and discharging, and the oxidation reaction and the reduction reaction are interchanged, thus, an electrode with a high reaction potential is called the positive electrode and an electrode with a low reaction potential is called the negative electrode. For this reason, in this specification, the positive electrode is referred to as a "positive electrode" or a "+ electrode (plus electrode)" and the negative electrode is referred to as a "negative electrode" or a "− electrode (minus electrode)" in any of the case where charging is performed, the case where discharging is performed, the case where a reverse pulse current is made to flow, and the case where charging current is made to flow. The use of terms such as anode (positive electrode) and cathode (negative electrode) related to oxidation reaction and reduction reaction might cause confusion because the anode and the cathode are reversed in charging and in discharging. Thus, the terms anode and cathode are not used in this specification. If the term anode or cathode is used, whether it is at the time of charging or discharging is noted and whether it corresponds to a positive electrode or a negative electrode is also noted.

Figure 12C:
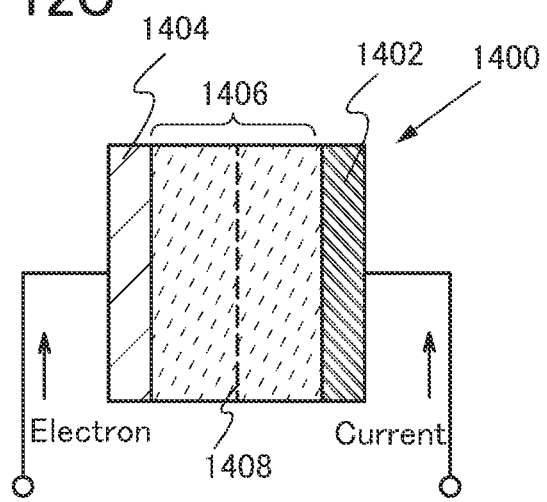
FIG. 12C is a model diagram of a secondary battery at the time of charging.

A charger is connected to two terminals shown in FIG. 12C to charge a storage battery 1400. As the charging of the storage battery 1400 proceeds, a potential difference between electrodes increases. The positive direction in FIG. 12C is the direction in which a current flows from a terminal outside the storage battery 1400 to a positive electrode 1402; from the positive electrode 1402 to a negative electrode 1404 in the storage battery 1400; and from the negative electrode to a terminal outside the storage battery 1400. In other words, the direction in which a charge current flows is regarded as the direction of a current. The storage battery 1400 includes an electrolyte solution 1406 between the positive electrode 1402 and the negative electrode 1404 and a separator 1408 is provided.

In this embodiment, an example of a lithium-ion secondary battery is shown; however, it is not limited to a lithium-ion secondary battery and a material including an element A, an element X, and oxygen can be used as a positive electrode material for the secondary battery. The element A is preferably one or more selected from the Group 1 elements and the Group 2 elements. As a Group 1 element, for example, an alkali metal such as lithium, sodium, or potassium can be used. As a Group 2 element, for example, calcium, beryllium, magnesium, or the like can be used. As the element X, for example, one or more selected from metal elements, silicon, and phosphorus can be used. The element X is preferably one or more selected from cobalt, nickel, manganese, iron, and vanadium. Typical examples include lithium manganate, lithium-cobalt composite oxide ($LiCoO_2$), and lithium iron phosphate ($LiFePO_4$).

The negative electrode includes a negative electrode active material layer and a negative electrode current collector. In addition, the negative electrode active material layer may contain a conductive additive and a binder.

For the negative electrode active material, an element that enables charge-discharge reaction by alloying and dealloying reactions with lithium can be used. For example, a material containing at least one of silicon, tin, gallium, aluminum, germanium, lead, antimony, bismuth, silver, zinc, cadmium, indium, and the like can be used. Such elements have higher capacity than carbon, and silicon in particular has a high theoretical capacity of 4200 mAh/g.

In addition, the secondary battery preferably includes a separator. As the separator, for example, a fiber containing cellulose such as paper; nonwoven fabric; a glass fiber; ceramics; a synthetic fiber using nylon (polyamide), vinylon (polyvinyl alcohol-based fiber), polyester, acrylic, polyolefin, or polyurethane; or the like can be used.

Regenerative energy generated by rolling of wheels 216 is transmitted to the motor 204 through a gear 205 and a motor controller 203 and the battery controller 202 charge the second battery 211 or the first battery 121.

The first battery 121 is mainly used for driving the motor 204 and supplies electric power to in-vehicle parts for a 42-V system (such as the cooling device 131 for the first battery 121, the heating device 132 for the first battery 121, an electric power steering, and a defogger) through a DCDC circuit 206. Even in the case where there is a rear motor for the rear wheels, the first battery 121 is used for driving the rear motor.

The second battery 211 supplies electric power to in-vehicle parts for a 14-V system (such as an audio control device 151, an audio speaker, a power window, and lamps) through a DCDC circuit 210.

Figure 4B:
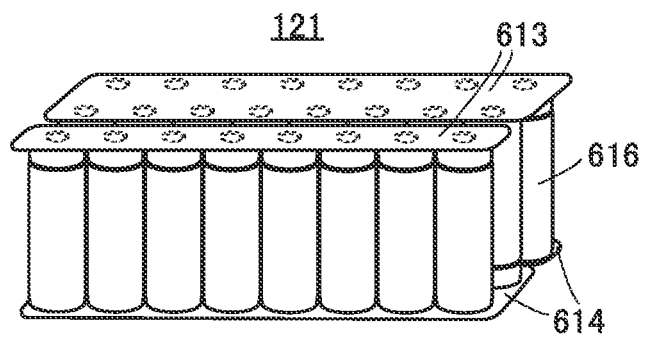
FIG. 4B is a perspective view of a secondary battery.

The first battery 121 is composed of a plurality of secondary batteries. For example, the cylindrical secondary battery 616 illustrated in FIG. 12A is used. As illustrated in FIG. 4B, the cylindrical secondary batteries 616 may be interposed between a conductive plate 613 and a conductive plate 614 to form a battery pack. In FIG. 4B, switches are not illustrated between the secondary batteries. The plurality of secondary batteries 616 may be connected in parallel, connected in series, or connected in series after being connected in parallel. By forming a battery pack including the plurality of secondary batteries 616, large electric power can be extracted.

In order to cut off electric power from the plurality of secondary batteries, the secondary batteries in the vehicle include a service plug or a circuit breaker which can cut off a high voltage without the use of equipment; these are provided in the first battery 121. For example, in the case where 48 battery packs which each include two to ten cells are connected in series, a service plug or a circuit breaker is placed between the 24th battery pack and the 25th battery pack.

Figure 11A:
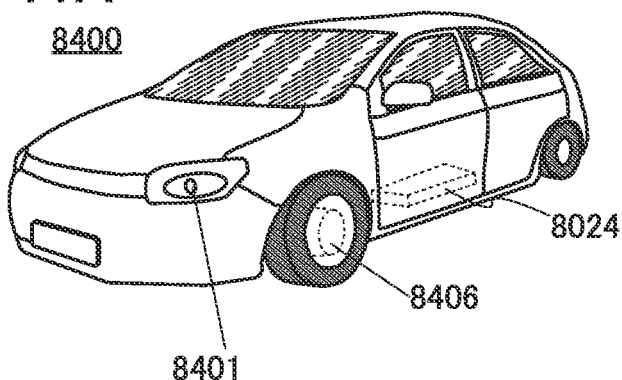
FIG. 11A, FIG. 11B, and FIG. 11C illustrate examples of moving objects.

FIG. 11 illustrates examples of vehicles each using the abnormality detection system of a secondary battery of one embodiment of the present invention. A secondary battery 8024 of an automobile 8400 illustrated in FIG. 11A not only drives an electric motor 8406 but also can supply electric power to a light-emitting device such as a headlight 8401 or a room light (not illustrated). For the secondary battery 8024 of the automobile 8400, the cylindrical secondary batteries 616 illustrated in FIG. 12B that are interposed between the conductive plate 613 and the conductive plate 614 to form a battery pack may be used.

Figure 11B:
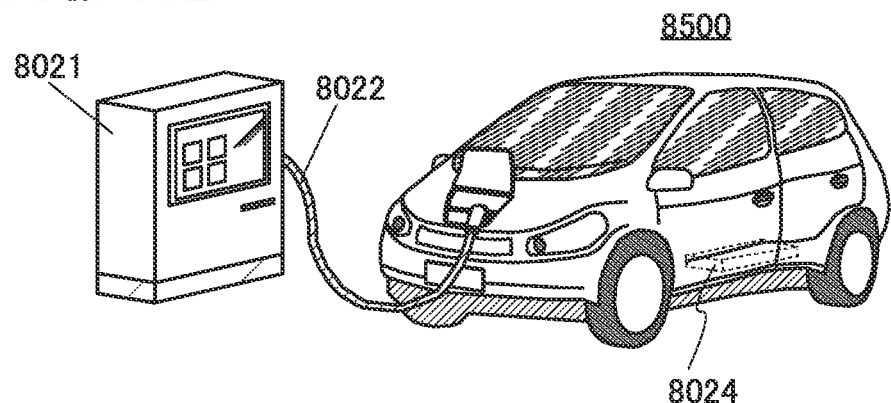

An automobile 8500 illustrated in FIG. 11B can be charged when a secondary battery included in the automobile 8500 is supplied with electric power from external charging equipment by a plug-in system, a contactless power feeding system, or the like. FIG. 11B illustrates a state in which the secondary battery 8024 incorporated in the automobile 8500 is charged with a ground-based charging apparatus 8021 through a cable 8022. Charging may be performed as appropriate by a given method such as CHAdeMO (registered trademark) or Combined Charging System as a charging method, the standard of a connector, or the like. The charging apparatus 8021 may be a charging station provided in a commercial facility or a power source in a house. For example, with a plug-in technique, the secondary battery 8024 incorporated in the automobile 8500 can be charged by power supply from the outside. Charging can be performed by converting AC power into DC power through a converter such as an ACDC converter.

Furthermore, although not illustrated, a power-receiving device can be incorporated in the vehicle, and the vehicle can be charged by being supplied with electric power from an above-ground power transmitting device in a contactless manner. In the case of this contactless power feeding system, by incorporating a power-transmitting device in a road or an exterior wall, charging is not limited to while the vehicle is stopped but also can be performed while the vehicle is running. In addition, this contactless power feeding system may be utilized to transmit and receive electric power between vehicles. Furthermore, a solar cell may be provided in the exterior of the vehicle to charge the secondary battery while the vehicle is stopped or while the vehicle is running. For supply of electric power in such a contactless manner, an electromagnetic induction method or a magnetic resonance method can be used.

Figure 11C:
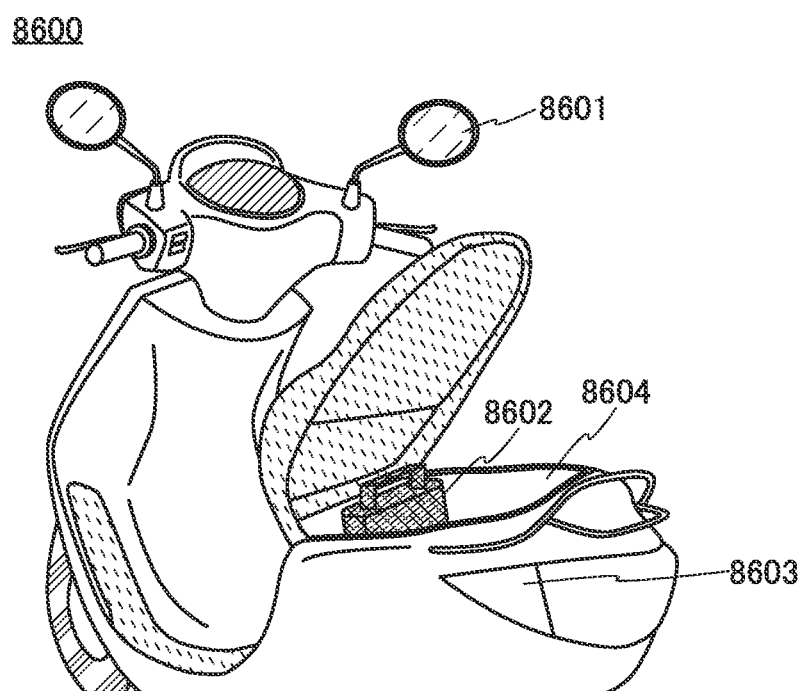

FIG. 11C is an example of a motorcycle using the secondary battery of one embodiment of the present invention. A scooter 8600 illustrated in FIG. 11C includes a secondary battery 8602, side mirrors 8601, and direction indicators 8603. The secondary battery 8602 can supply electricity to the direction indicators 8603.

Furthermore, in the scooter 8600 illustrated in FIG. 11C, the secondary battery 8602 can be stored in an under-seat storage 8604. The secondary battery 8602 can be stored in the under-seat storage 8604 even when the under-seat storage 8604 is small. Furthermore, this embodiment can also be applied to a power source of a snowmobile or a personal watercraft as well as a scooter.

This embodiment can be combined with any of the other embodiments as appropriate.

Embodiment 3

In this embodiment, circuit structure examples of a memory means are illustrated in FIG. 6A to FIG. 6G. FIG. 6A to FIG. 6G each function as a memory element. A memory element 410 shown in FIG. 6A includes the transistor M1 and a capacitor CA. The memory element 410 is a memory element including one transistor and one capacitor.

A first terminal of the transistor M1 is connected to a first terminal of the capacitor CA. A second terminal of the transistor M1 is connected to a wiring BL. Agate of the transistor M1 is connected to a wiring WL. A back gate of the transistor M1 is connected to a wiring BGL. A second terminal of the capacitor CA is connected to a wiring CAL. A node to which the first terminal of the transistor M1 and the first terminal of the capacitor CA are electrically connected is referred to as a node ND.

In an actual transistor, a gate and a back gate are provided to overlap with each other with a channel formation region of a semiconductor layer therebetween. The gate and the back gate can each function as a gate. Thus, when one of them is referred to as a "back gate", the other is referred to as a "gate" or a "front gate" in some cases. In some other cases, one of them is referred to as a "first gate" and the other is referred to as a "second gate".

The potential of the back gate may be the same as the potential of the gate, or may be a ground potential or a given potential. By changing the potential of the back gate independently of that of the gate, the threshold voltage of the transistor can be changed.

Providing the back gate and setting the potentials of the gate and the back gate electrode to be the same, a region of the semiconductor layer through which carriers flow is enlarged in the film thickness direction; thus, the amount of carrier transfer is increased. As a result, the on-state current of the transistor is increased and the field-effect mobility is increased.

Thus, the transistor can be a transistor having high on-state current for its occupation area. That is, the occupation area of the transistor can be small for required on-state current. Accordingly, a semiconductor device having a high degree of integration can be provided.

The wiring BGL functions as a wiring for applying a potential to the back gate of the transistor M1. By applying a given potential to the wiring BGL, the threshold voltage of the transistor M1 can be increased or decreased.

Data write and read are performed in such a manner that a high-level potential is applied to the wiring WL to turn on the transistor M1 so that the wiring BL is electrically connected to the node ND.

The wiring CAL functions as a wiring for applying a predetermined potential to the second terminal of the capacitor CA. A fixed potential is preferably applied to the wiring CAL.

A memory element 420 shown in FIG. 6B is a modification example of the memory element 410. In the memory element 420, the back gate of the transistor M1 is electrically connected to the wiring WL. With such a structure, a potential which is the same as that of the gate of the transistor M1 can be applied to the back gate of the transistor M1. Thus, the amount of current flowing through the transistor M1 can be increased when the transistor M1 is on.

As in the memory element 430 shown in FIG. 6C, the transistor M1 may be a single-gate transistor (a transistor without a back gate). The memory element 430 has a structure of the memory element 410 and the memory element 420 from which the back gate of the transistor M1 is eliminated. Thus, the number of fabrication steps of the memory element 430 can be smaller than those of the memory element 410 and the memory element 420.

The memory element 410, the memory element 420, and the memory element 430 are each a DRAM-type memory element.

An oxide semiconductor is preferably used for a semiconductor layer in which a channel of the transistor M1 is formed. In this specification and the like, a transistor including an oxide semiconductor in a semiconductor layer in which a channel is formed is also referred to as an "OS transistor".

For example, as the oxide semiconductor, an oxide semiconductor containing any one of indium, an element M (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like), and zinc can be used. In particular, the oxide semiconductor preferably contains indium, gallium, and zinc.

An OS transistor has a characteristic of an extremely low off-state current. When an OS transistor is used as the transistor M1, the leakage current of the transistor M1 can be extremely low. That is, written data can be retained for a long time with the transistor M1. Thus, the frequency of refresh of the memory element can be reduced. In addition, refresh operation of the memory element can be omitted. Furthermore, since the leakage current is extremely low, multilevel data or analog data can be retained in the memory element 410, the memory element 420, and the memory element 430.

In this specification and the like, a DRAM using an OS transistor is referred to as a DOSRAM (Dynamic Oxide Semiconductor Random Access Memory).

Figure 6D:
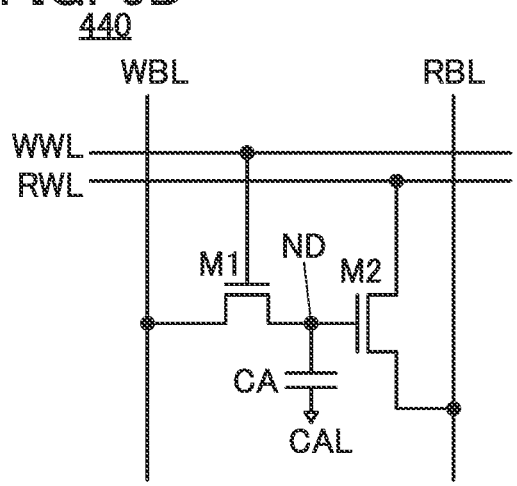

FIG. 6D shows a circuit structure example of a gain-cell memory element made up of two transistors and one capacitor. A memory element 440 includes the transistor M1, a transistor M2, and the capacitor CA.

The first terminal of the transistor M1 is connected to the first terminal of the capacitor CA, the second terminal of the transistor M1 is connected to a bit line WBL, and the gate of the transistor M1 is connected to a word line WWL. The second terminal of the capacitor CA is connected to the wiring CAL. A first terminal of the transistor M2 is connected to a bit line RBL, a second terminal of the transistor M2 is connected to a word line RWL, and a gate of the transistor M2 is connected to the first terminal of the capacitor CA. A node to which the first terminal of the transistor M1, the first terminal of the capacitor CA, and the gate of the transistor M2 are electrically connected is referred to as the node ND.

The bit line WBL functions as a write bit line, the bit line RBL functions as a read bit line, the word line WWL functions as a write word line, and the word line RWL functions as a read word line. The transistor M1 has a function of a switch for controlling conduction or non-conduction between the node ND and the bit line WBL.

It is preferable to use an OS transistor as the transistor M1. As described above, since the OS transistor has extremely low off-state current, a potential written to the node ND can be retained for a long time when the OS transistor is used as the transistor M1. In other words, data written in the memory element can be retained for a long time.

A transistor to be used as the transistor M2 is not particularly limited. Any of an OS transistor, a Si transistor (a transistor in which silicon is used for a semiconductor layer), and other transistors may be used as the transistor M2.

Note that in the case where a Si transistor is used as the transistor M2, silicon used for the semiconductor layer may be amorphous silicon, polycrystalline silicon, low-temperature poly-silicon (LTPS), or single crystal silicon. Since a Si transistor has higher field-effect mobility than an OS transistor in some cases, the use of the Si transistor as a read transistor can improve the operation speed at the time of read.

In the case where an OS transistor is used as the transistor M1 and a Si transistor is used as the transistor M2, the two transistors may be provided in different layers to be stacked on one another. An OS transistor can be fabricated with the same manufacturing equipment by the same process as those of a Si transistor. Thus, hybridization of an OS transistor and a Si transistor is easy, and higher integration is also easy.

Furthermore, when an OS transistor is used as the transistor M2, its leakage current when being non-selected can be extremely low; thus, reading accuracy can be improved. When an OS transistor is used for each of the transistor M1 and the transistor M2, the number of fabrication steps of the semiconductor device can be reduced and the productivity can be improved. It is possible to fabricate the semiconductor device at a process temperature of 400° C. or lower, for example.

Figure 6E:
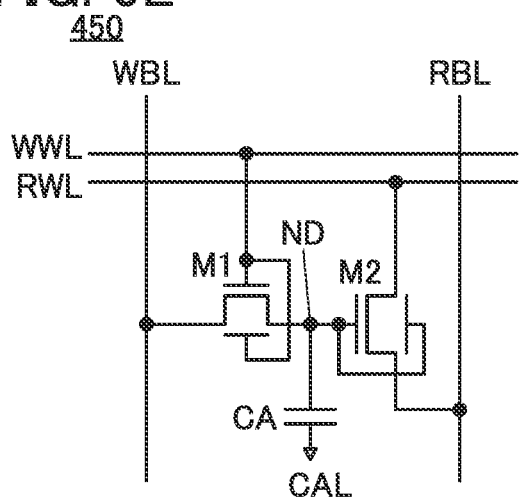
Figure 6F:
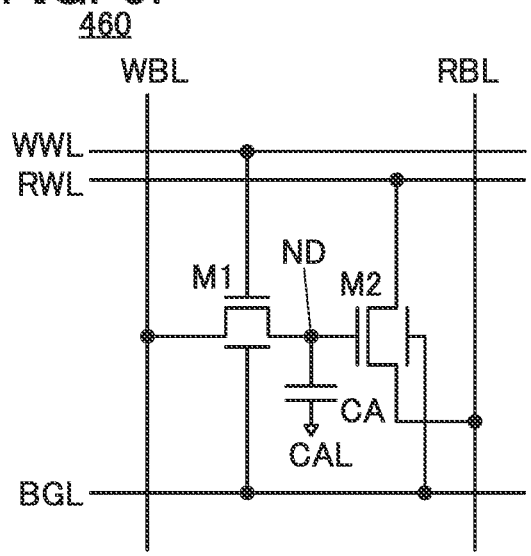
Figure 6G:
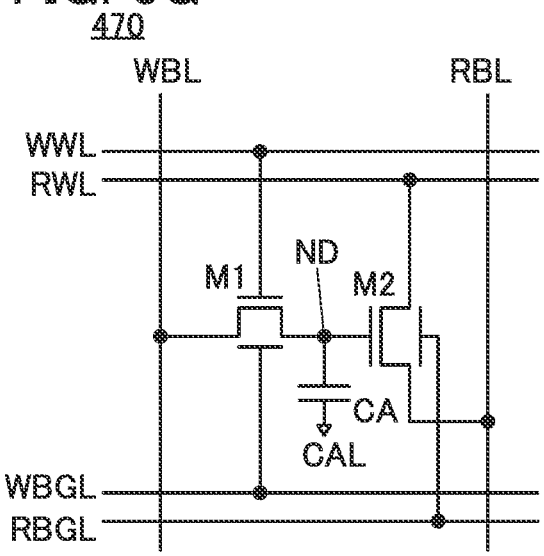

Circuit structure examples of the case where a transistor having a back gate (four-terminal transistor, also referred to as a "four-terminal element") is used as each of the transistor M1 and the transistor M2 are shown in FIG. 6E to FIG. 6G. A memory element 450 shown in FIG. 6E, a memory element 460 shown in FIG. 6F, and a memory element 470 shown in FIG. 6G are modification examples of the memory element 440.

In the memory element 450 shown in FIG. 6E, the gate and the back gate of the transistor M1 are electrically connected to each other. In addition, the gate and the back gate of the transistor M2 are electrically connected to each other.

In the memory element 460 shown in FIG. 6F, the back gate of the transistor M1 and the back gate of the transistor M2 are electrically connected to the wiring BGL. A predetermined potential can be applied to the back gates of the transistor M1 and the transistor M2 through the wiring BGL.

In the memory element 470 shown in FIG. 6G, the back gate of the transistor M1 is electrically connected to a wiring WBGL, and the back gate of the transistor M2 is electrically connected to a wiring RBGL. When the back gate of the transistor M1 and the back gate of the transistor M2 are connected to different wirings, the threshold voltages can be changed independently of each other.

The memory element 440 to the memory element 470 are each a 2Tr1C-type memory cell. In this specification and the like, a memory device constituting a 2Tr1C-type memory cell using an OS transistor as the transistor M1 is referred to as a NOSRAM (Non-volatile Oxide Semiconductor Random Access Memory). The memory element 440 to the memory element 470 are capable of reading the potential of the node ND by amplifying the potential with the transistor M2. Since the off-state current of an OS transistor is extremely low, the potential of the node ND can be retained for a long time. In addition, non-destructive read is possible, with which the potential of the node ND remains retained even after the read operation.

Data retained in the memory element is data with less rewrite frequency. Thus, it is preferable to use, as the memory element, a NOSRAM, which is capable of non-destructive read and long-term retention of data.

The transistors shown in FIG. 6A, FIG. 6B, and FIG. 6E to FIG. 6G are each a four-terminal element; hence, its input and output can be controlled independently of each other in a simpler manner than that in two-terminal elements typified by MRAM (Magnetoresistive Random Access Memory)

utilizing MTJ (Magnetic Tunnel Junction) properties, ReRAM (Resistive Random Access Memory), and phase-change memory.

In addition, the structure of MRAM, ReRAM, and phase-change memory may change at the atomic level when data is rewritten. By contrast, in the memory device of one embodiment of the present invention, data rewrite is performed by charging or discharging of electric charge via transistors; thus, the memory device has characteristics such as high rewrite endurance and less structure changes.

Embodiment 4

In this embodiment is explained a transistor structure which can be used for the structure of the memory element in the above-described embodiment; specifically, a structure in which transistors with different electrical properties are stacked. In this embodiment, structures of transistors included in a memory circuit of a semiconductor device are particularly described. With such a structure, the degree of freedom in design of the semiconductor device can be increased. Stacking transistors with different electrical properties can increase the integration degree of the semiconductor device.

Figure 7:
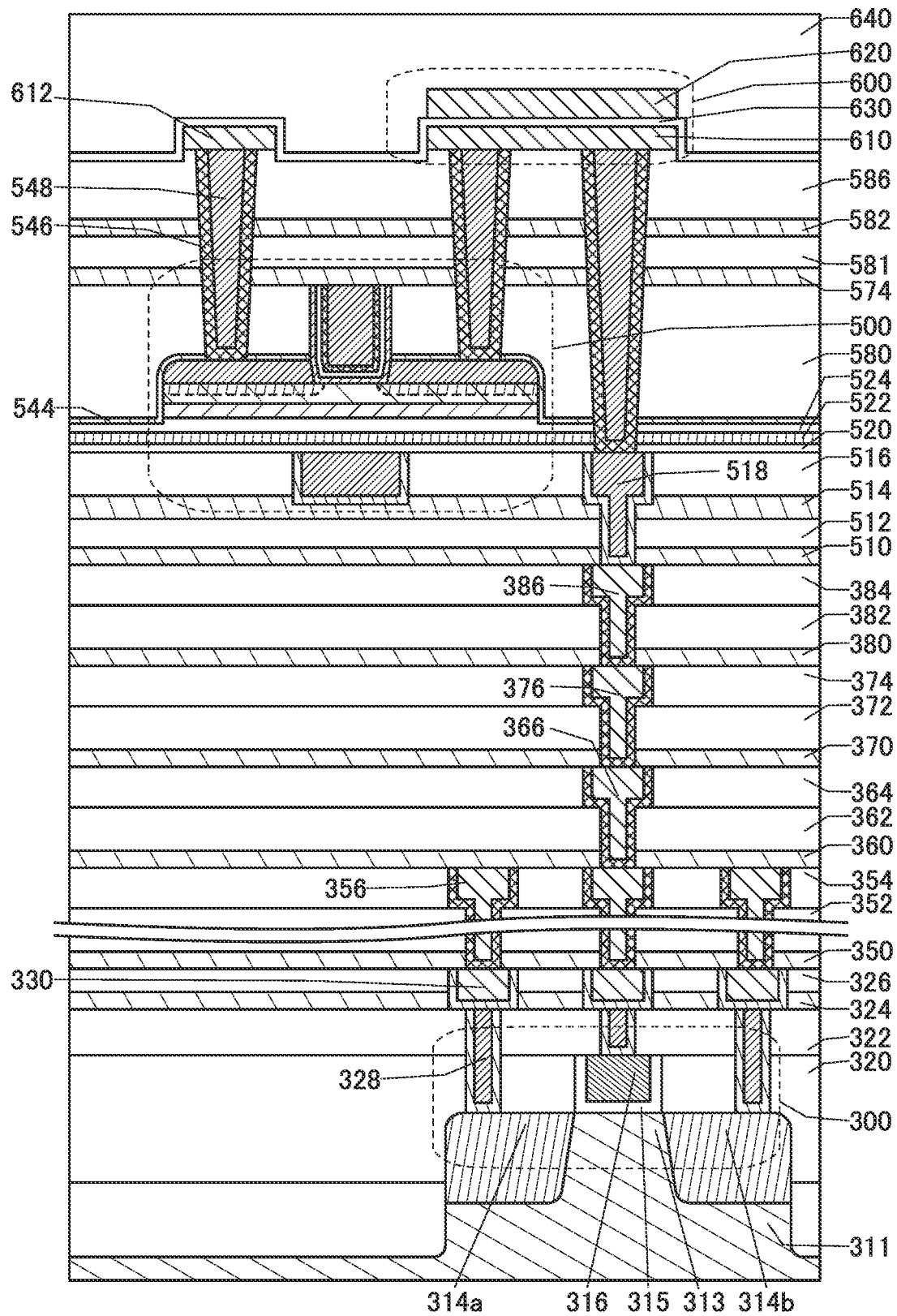
FIG. 7 is a cross-sectional view illustrating examples of transistors.
Figure 9A:
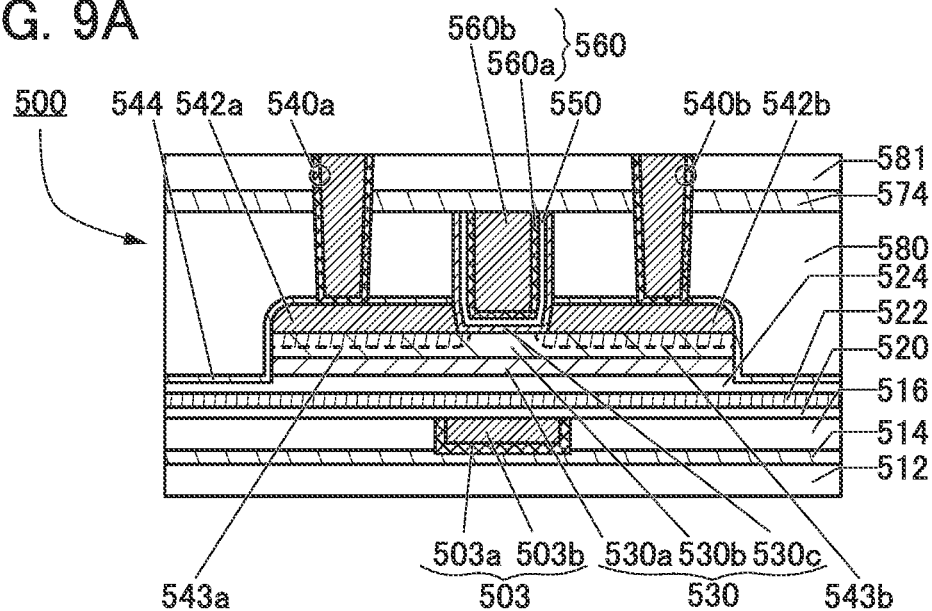
FIG. 9A, FIG. 9B, and FIG. 9C are cross-sectional views illustrating examples of transistors.
Figure 9B:
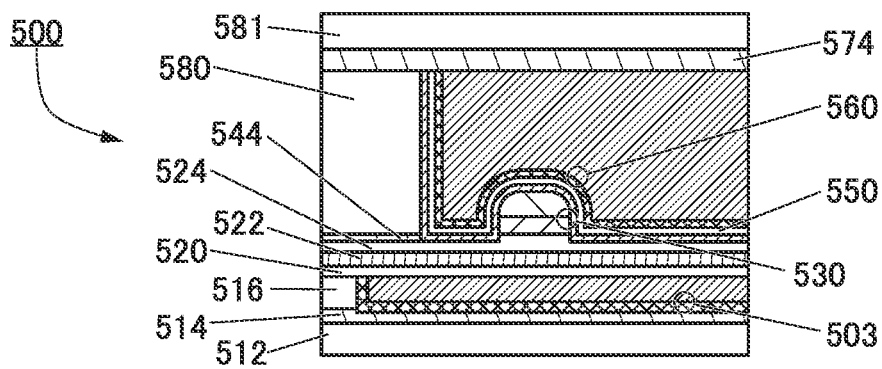
Figure 9C:
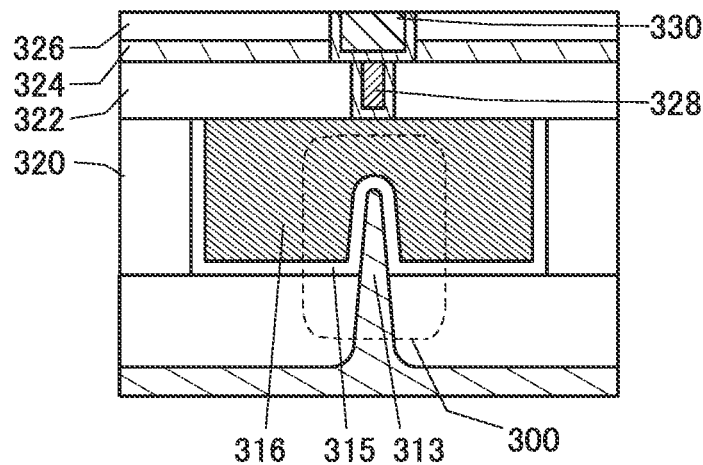

A semiconductor device illustrated in FIG. 7 includes a transistor 300, a transistor 500, and a capacitor 600. FIG. 9A is a cross-sectional view of the transistor 500 in the channel length direction, FIG. 9B is a cross-sectional view of the transistor 500 in the channel width direction, and FIG. 9C is a cross-sectional view of the transistor 300 in the channel width direction.

The transistor 500 is a transistor including an oxide semiconductor in its channel formation region (an OS transistor). Since the off-state current of the transistor 500 is low, the use of the transistor 500 as an OS transistor included in a semiconductor device enables long-term retention of written data voltage or charges. In other words, power consumption of the semiconductor device can be reduced because the semiconductor device has a low frequency of refresh operation or requires no refresh operation.

The semiconductor device described in this embodiment includes the transistor 300, the transistor 500, and the capacitor 600 as illustrated in FIG. 7. The transistor 500 is provided above the transistor 300, and the capacitor 600 is provided above the transistor 300 and the transistor 500. Note that the capacitor 600 can be a capacitor in a memory circuit, for example.

The transistor 300 is provided over a substrate 311 and includes a conductor 316, an insulator 315, a semiconductor region 313 that is part of the substrate 311, and a low-resistance region 314a and a low-resistance region 314b functioning as a source region and a drain region. Note that the transistor 300 can be used, for example, as the transistor included in the memory circuit in the above embodiment.

As shown in FIG. 9C, in the transistor 300, a top surface and a side surface in the channel width direction of the semiconductor region 313 are covered with the conductor 316 with the insulator 315 therebetween. Such a Fin-type transistor 300 can have an increased effective channel width, and thus have improved on-state characteristics. In addition, since contribution of an electric field of a gate electrode can be increased, the off-state characteristics of the transistor 300 can be improved.

Note that the transistor 300 can be either a p-channel transistor or an n-channel transistor.

A region of the semiconductor region 313 where a channel is formed, a region in the vicinity thereof, the low-resistance region 314a and the low-resistance region 314b functioning as a source region and a drain region, and the like preferably contain a semiconductor such as a silicon-based semiconductor, and preferably contain single crystal silicon. Alternatively, the regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and thereby changing the lattice spacing is used. Alternatively, the transistor 300 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

For the conductor 316 functioning as a gate electrode, a semiconductor material such as silicon containing the element which imparts n-type conductivity, such as arsenic or phosphorus, or the element which imparts p-type conductivity, such as boron, or a conductive material such as a metal material, an alloy material, or an oxide semiconductor material can be used.

Note that since the work function of a conductor depends on the material of the conductor, the threshold voltage of the transistor can be adjusted by selecting the material of the conductor. Specifically, it is preferable to use a material such as titanium nitride or tantalum nitride for the conductor. Moreover, in order to obtain both conductivity and embeddability, it is preferable to use stacked layers of metal materials such as tungsten and aluminum for the conductor, and it is particularly preferable to use tungsten in terms of heat resistance.

Figure 8:
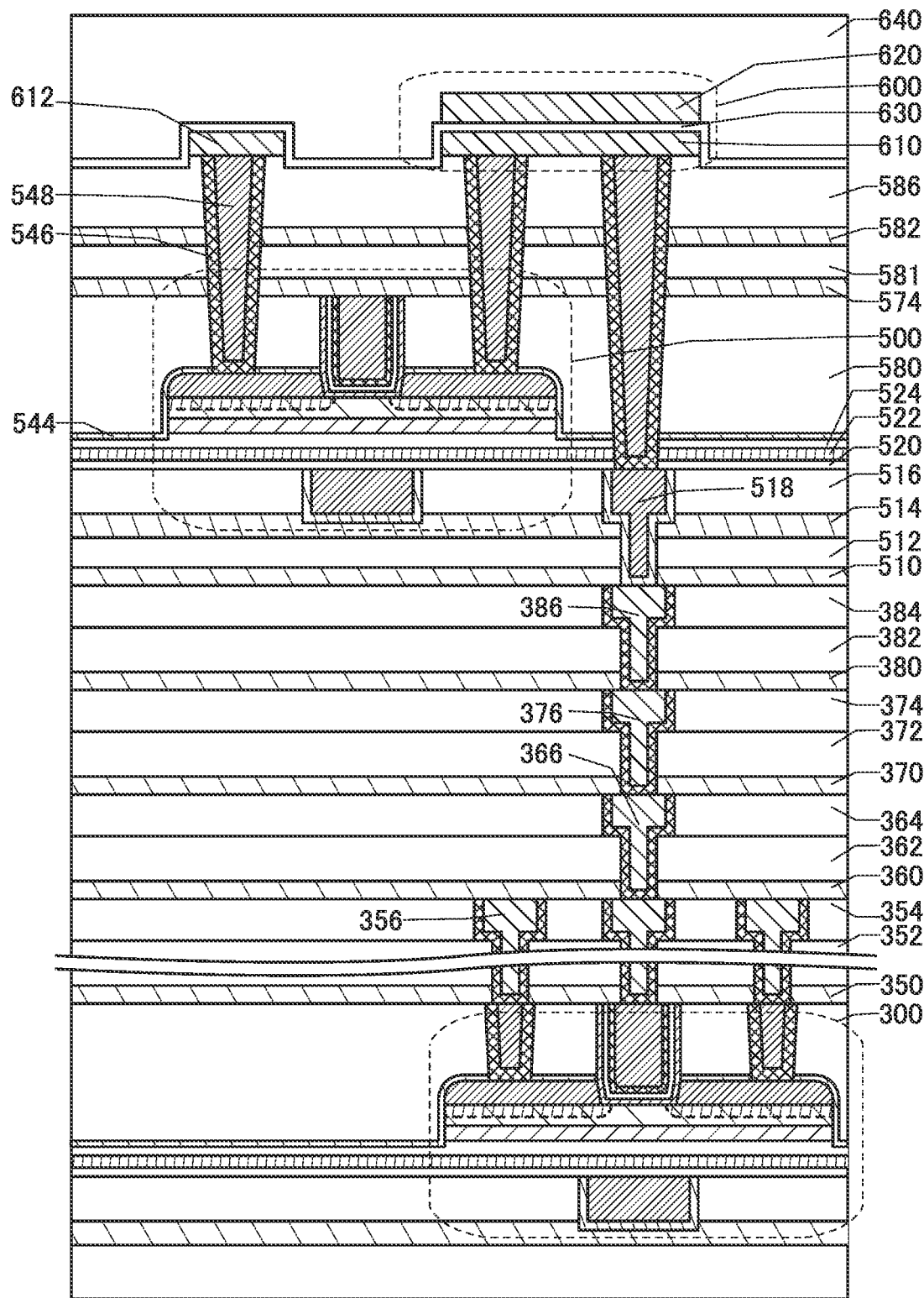
FIG. 8 is a cross-sectional view illustrating examples of transistors.

Note that the transistor 300 illustrated in FIG. 7 is an example and the structure is not limited thereto; a transistor appropriate for a circuit structure or a driving method is used. In the case where all the transistors included in the semiconductor device are the OS transistors and have the same conductivity, which means the same-polarity transistors such as n-channel transistors only, for example, the transistor 300 has a structure similar to that of the transistor 500 including an oxide semiconductor as shown in FIG. 8. Note that the details of the transistor 500 are described later.

An insulator 320, an insulator 322, an insulator 324, and an insulator 326 are stacked sequentially and provided to cover the transistor 300.

For the insulator 320, the insulator 322, the insulator 324, and the insulator 326, silicon oxide, silicon oxynitride, silicon nitride oxide, silicon nitride, aluminum oxide, aluminum oxynitride, aluminum nitride oxide, aluminum nitride, or the like is used, for example.

Note that in this specification, silicon oxynitride refers to a material that contains oxygen at a higher proportion than nitrogen, and silicon nitride oxide refers to a material that contains nitrogen at a higher proportion than oxygen. Furthermore, in this specification, aluminum oxynitride refers to a material that contains oxygen at a higher proportion than nitrogen, and aluminum nitride oxide refers to a material that contains nitrogen at a higher proportion than oxygen.

The insulator 322 may have a function of a planarization film for planarizing a level difference caused by the transistor 300 or the like provided below the insulator 322. For example, a top surface of the insulator 322 may be planarized by planarization treatment using a chemical mechanical polishing (CMP) method or the like to improve planarity.

In addition, as the insulator 324, it is preferable to use a film having a barrier property that prevents diffusion of hydrogen or impurities from the substrate 311, the transistor 300, or the like into a region where the transistor 500 is provided.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

The amount of released hydrogen can be analyzed by thermal desorption spectroscopy (TDS) or the like, for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$, in the TDS analysis in a film-surface temperature range of 50° C. to 500° C., for example.

Note that the dielectric constant of the insulator 326 is preferably lower than that of the insulator 324. For example, the relative permittivity of the insulator 326 is preferably lower than 4, further preferably lower than 3. The relative permittivity of the insulator 326 is, for example, preferably 0.7 times or less, further preferably 0.6 times or less the dielectric constant of the insulator 324. When a material with a low dielectric constant is used for an interlayer film, the parasitic capacitance generated between wirings can be reduced.

In addition, a conductor 328, a conductor 330, and the like that are connected to the capacitor 600 or the transistor 500 are embedded in the insulator 320, the insulator 322, the insulator 324, and the insulator 326. Note that the conductor 328 and the conductor 330 each have a function of a plug or a wiring. Furthermore, a plurality of conductors functioning as plugs or wirings are collectively denoted by the same reference numeral in some cases. Moreover, in this specification and the like, a wiring and a plug connected to the wiring may be a single component. That is, there are cases where part of a conductor functions as a wiring and part of a conductor functions as a plug.

As a material for each of the plugs and wirings (the conductor 328, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is preferable to use tungsten. Alternatively, it is preferable to form the plugs and wirings with a low-resistance conductive material such as aluminum or copper. The use of a low-resistance conductive material can reduce wiring resistance.

A wiring layer may be provided over the insulator 326 and the conductor 330. For example, in FIG. 7, an insulator 350, an insulator 352, and an insulator 354 are provided to be stacked in this order. Furthermore, a conductor 356 is formed in the insulator 350, the insulator 352, and the insulator 354. The conductor 356 has a function of a plug or a wiring that is connected to the transistor 300. Note that the conductor 356 can be provided using a material similar to those for the conductor 328 and the conductor 330.

Note that for example, for the insulator 350, like the insulator 324, an insulator having a barrier property against hydrogen is preferably used. Furthermore, the conductor 356 preferably contains a conductor having a barrier property against hydrogen. In particular, the conductor having a barrier property against hydrogen is formed in an opening portion of the insulator 350 having a barrier property against hydrogen. With this structure, the transistor 300 and the transistor 500 can be separated by a barrier layer, so that diffusion of hydrogen from the transistor 300 into the transistor 500 can be inhibited.

Note that as the conductor having a barrier property against hydrogen, tantalum nitride is preferably used, for example. In addition, the use of a stack including tantalum nitride and tungsten, which has high conductivity, can inhibit diffusion of hydrogen from the transistor 300 while the conductivity of a wiring is kept. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 7, an insulator 360, an insulator 362, and an insulator 364 are provided to be stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328 and the conductor 330.

Note that for example, for the insulator 360, like the insulator 324, an insulator having a barrier property against hydrogen is preferably used. Furthermore, the conductor 366 preferably contains a conductor having a barrier property against hydrogen. In particular, the conductor having a barrier property against hydrogen is formed in an opening portion of the insulator 360 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 364 and the conductor 366. For example, in FIG. 7, an insulator 370, an insulator 372, and an insulator 374 are provided to be stacked in this order. Furthermore, a conductor 376 is formed in the insulator 370, the insulator 372, and the insulator 374. The conductor 376 has a function of a plug or a wiring. Note that the conductor 376 can be provided using a material similar to those for the conductor 328 and the conductor 330.

Note that for example, for the insulator 370, like the insulator 324, an insulator having a barrier property against hydrogen is preferably used. Furthermore, the conductor 376 preferably contains a conductor having a barrier property against hydrogen. In particular, the conductor having a barrier property against hydrogen is formed in an opening portion of the insulator 370 having a barrier property against hydrogen. With this structure, the transistor 300 and the transistor 500 can be separated by a barrier layer, so that diffusion of hydrogen from the transistor 300 into the transistor 500 can be inhibited.

A wiring layer may be provided over the insulator 374 and the conductor 376. For example, in FIG. 7, an insulator 380, an insulator 382, and an insulator 384 are provided to be stacked in this order. Furthermore, a conductor 386 is formed in the insulator 380, the insulator 382, and the insulator 384. The conductor 386 has a function of a plug or a wiring. Note that the conductor 386 can be provided using a material similar to those for the conductor 328 and the conductor 330.

Note that for example, for the insulator 380, like the insulator 324, an insulator having a barrier property against hydrogen is preferably used. Furthermore, the conductor 386 preferably contains a conductor having a barrier property against hydrogen. In particular, the conductor having a barrier property against hydrogen is formed in an opening portion of the insulator 380 having a barrier property against hydrogen. With this structure, the transistor 300 and the transistor 500 can be separated by a barrier layer, so that diffusion of hydrogen from the transistor 300 into the transistor 500 can be inhibited.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially and provided over the insulator 384. A substance having a barrier property against oxygen or hydrogen is preferably used for any of the insulator 510, the insulator 512, the insulator 514, and the insulator 516.

For example, for the insulator 510 and the insulator 514, it is preferable to use a film having a barrier property that prevents diffusion of hydrogen or impurities from the substrate 311, a region where the transistor 300 is provided, or the like into a region where the transistor 500 is provided. Therefore, a material similar to that for the insulator 324 can be used.

For the film having a barrier property against hydrogen, silicon nitride formed by a CVD method can be used, for example. Here, diffusion of hydrogen to a semiconductor element including an oxide semiconductor, such as the transistor 500, degrades the characteristics of the semiconductor element in some cases. Therefore, a film that inhibits hydrogen diffusion is preferably used between the transistor 500 and the transistor 300. The film that inhibits hydrogen diffusion is specifically a film from which a small amount of hydrogen is released.

In addition, for the film having a barrier property against hydrogen, a metal oxide such as aluminum oxide, hafnium oxide, or tantalum oxide is preferably used for the insulator 510 and the insulator 514, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, for the insulator 512 and the insulator 516, a material similar to that for the insulator 320 can be used, for example. Furthermore, when a material with a comparatively low dielectric constant is used for these insulators, parasitic capacitance generated between wirings can be reduced. A silicon oxide film, a silicon oxynitride film, or the like can be used for the insulator 512 and the insulator 516, for example.

Furthermore, a conductor 518, a conductor included in the transistor 500 (a conductor 503 for example), and the like are embedded in the insulator 510, the insulator 512, the insulator 514, and the insulator 516. Note that the conductor 518 has a function of a plug or a wiring that is connected to the capacitor 600 or the transistor 300. The conductor 518 can be provided using a material similar to those for the conductor 328 and the conductor 330.

In particular, the conductor 518 in a region in contact with the insulator 510 and the insulator 514 is preferably a conductor having a barrier property against oxygen, hydrogen, and water. With this structure, the transistor 300 and the transistor 500 can be separated by a layer having a barrier property against oxygen, hydrogen, and water, thus, diffusion of hydrogen from the transistor 300 into the transistor 500 can be inhibited.

The transistor 500 is provided above the insulator 516.

As shown in FIG. 9A and FIG. 9B, the transistor 500 includes the conductor 503 positioned to be embedded in the insulator 514 and the insulator 516, an insulator 520 positioned over the insulator 516 and the conductor 503, an insulator 522 positioned over the insulator 520, an insulator 524 positioned over the insulator 522, an oxide 530a positioned over the insulator 524, an oxide 530b positioned over the oxide 530a, a conductor 542a and a conductor 542b positioned apart from each other over the oxide 530b, an insulator 580 that is positioned over the conductor 542a and the conductor 542b and is provided with an opening formed to overlap with a region between the conductor 542a and the conductor 542b, an oxide 530c positioned on a bottom surface and a side surface of the opening, an insulator 550 positioned on the formation surface of the oxide 530c, and a conductor 560 positioned on the formation surface of the insulator 550.

As shown in FIG. 9A and FIG. 9B, an insulator 544 is preferably provided between the insulator 580 and the oxide 530a, the oxide 530b, the conductor 542a, and the conductor 542b. As shown in FIG. 9A and FIG. 9B, the conductor 560 preferably includes a conductor 560a provided inside the insulator 550 and a conductor 560b provided to be embedded inside the conductor 560a. As shown in FIG. 9A and FIG. 9B, an insulator 574 is preferably provided over the insulator 580, the conductor 560, and the insulator 550.

Note that in the following description, the oxide 530a, the oxide 530b, and the oxide 530c are sometimes collectively referred to as an oxide 530.

Note that although a structure of the transistor 500 in which three layers of the oxide 530a, the oxide 530b, and the oxide 530c are stacked in a region where a channel is formed and its vicinity is shown, the present invention is not limited thereto. For example, a single layer of the oxide 530b, a two-layer structure of the oxide 530b and the oxide 530a, a two-layer structure of the oxide 530b and the oxide 530c, or a stacked-layer structure of four or more layers may be employed. Furthermore, although the conductor 560 is shown to have a stacked-layer structure of two layers in the transistor 500, the present invention is not limited thereto. For example, the conductor 560 may have a single-layer structure or a stacked-layer structure of three or more layers. Moreover, the transistor 500 shown in FIG. 7 and FIG. 9A is an example and the structure is not limited thereto; an appropriate transistor is used in accordance with a circuit structure or a driving method.

Here, the conductor 560 functions as a gate electrode of the transistor, and the conductor 542a and the conductor 542b function as a source electrode and a drain electrode. As described above, the conductor 560 is formed to be embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be positioned between the source electrode and the drain electrode in a self-aligned manner. Therefore, the conductor 560 can be formed without an alignment margin, resulting in a reduction in the area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 does not have a region overlapping with the conductor 542a or the conductor 542b. Thus, parasitic capacitance formed between the conductor 560 and each of the conductor 542a and the conductor 542b can be reduced. As a result, the switching speed of the transistor 500 can be improved, and the transistor 500 can have high frequency characteristics.

The conductor 560 sometimes functions as a first gate (also referred to as top gate) electrode. In addition, the conductor 503 sometimes functions as a second gate (also referred to as bottom gate) electrode. In that case, the threshold voltage of the transistor 500 can be controlled by changing a potential applied to the conductor 503 independently of a potential applied to the conductor 560. In particular, the threshold voltage of the transistor 500 can be higher than 0 V and the off-state current can be reduced by applying a negative potential to the conductor 503. Thus, a drain current at the time when a potential applied to the conductor 560 is 0 V can be lower in the case where a negative potential is applied to the conductor 503 than in the case where a negative potential is not applied to the conductor 503.

The conductor 503 is positioned to overlap with the oxide 530 and the conductor 560. Thus, in the case where potentials are applied to the conductor 560 and the conductor 503, an electric field generated from the conductor 560 and an electric field generated from the conductor 503 are connected, so that a channel formation region formed in the oxide 530 can be covered. In this specification and the like, a transistor structure in which a channel formation region is electrically surrounded by electric fields of a first gate electrode and a second gate electrode is referred to as a surrounded channel (S-channel) structure.

Furthermore, in this specification and the like, the surrounded channel (S-channel) structure has a feature in that the side surface and the vicinity of the oxide 530 in contact with the conductor 542a and the conductor 542b functioning as a source electrode and a drain electrode are of I-type like the channel formation region. The side surface and the vicinity of the oxide 530 in contact with the conductor 542a and the conductor 542b are in contact with the insulator 544 and thus can be of I-type like the channel formation region. Note that in this specification and the like, "I-type" can be equated with "highly purified intrinsic" to be described later. The S-channel structure disclosed in this specification and the like is different from a Fin-type structure and a planar structure. With the S-channel structure, resistance to a short-channel effect can be enhanced, that is, a transistor in which a short-channel effect is less likely to occur can be provided.

In addition, the conductor 503 has a structure similar to that of the conductor 518; a conductor 503a is formed in contact with an inner wall of an opening in the insulator 514 and the insulator 516, and a conductor 503b is formed on the inner side. Note that although the transistor 500 having a structure in which the conductor 503a and the conductor 503b are stacked is shown, the present invention is not limited thereto. For example, the conductor 503 may be provided as a single layer or to have a stacked-layer structure of three or more layers.

Here, for the conductor 503a, a conductive material that has a function of inhibiting diffusion of impurities such as a hydrogen atom, a hydrogen molecule, a water molecule, and a copper atom (through which the impurities are less likely to pass) is preferably used. Alternatively, it is preferable to use a conductive material that has a function of inhibiting diffusion of oxygen (e.g., at least one of an oxygen atom, an oxygen molecule, and the like) (through which oxygen is less likely to pass). Note that in this specification, a function of inhibiting diffusion of impurities or oxygen means a function of inhibiting diffusion of any one or all of the impurities and oxygen.

For example, when the conductor 503a has a function of inhibiting diffusion of oxygen, a reduction in conductivity of the conductor 503b due to oxidation can be inhibited.

In addition, in the case where the conductor 503 also functions as a wiring, a conductive material with high conductivity that contains tungsten, copper, or aluminum as its main component is preferably used for the conductor 503b. In that case, the conductor 505 is not necessarily provided. Note that the conductor 503b is shown as a single layer but may have a stacked-layer structure, for example, a stack of the above conductive material and titanium or titanium nitride.

The insulator 520, the insulator 522, and the insulator 524 have a function of a second gate insulating film.

Here, as the insulator 524 in contact with the oxide 530, an insulator that contains oxygen more than oxygen in the stoichiometric composition is preferably used. That is, an excess-oxygen region is preferably formed in the insulator 524. When such an insulator containing excess oxygen is provided in contact with the oxide 530, oxygen vacancies in the oxide 530 can be reduced and the reliability of the transistor 500 can be improved.

As the insulator including an excess-oxygen region, specifically, an oxide material that releases part of oxygen by heating is preferably used. An oxide film that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably higher than or equal to 100° C. and lower than or equal to 700° C., or higher than or equal to 100° C. and lower than or equal to 500° C.

One or a plurality of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of $V_O H$ is cut occurs, i.e., a reaction of "$V_OH \rightarrow V_O+H$" occurs. Some hydrogen generated at this time is bonded to oxygen to be $H_2O$, and removed from the oxide 530 or the insulator in the vicinity of the oxide 530 in some cases. Some hydrogen is diffused into or trapped (also referred to as gettering) by the conductor 542 in some cases.

For the microwave treatment, for example, an apparatus including a power source that generates high-density plasma or an apparatus including a power source that applies RF to the substrate side is suitably used. For example, the use of a gas containing oxygen and high-density plasma enables high-density oxygen radicals to be generated, and RF application to the substrate side allows the oxygen radicals generated by the high-density plasma to be efficiently introduced into the oxide 530 or the insulator in the vicinity of the oxide 530. Thus, the pressure during the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio ($O_2/(O_2+Ar)$) is lower than or equal to 50%, preferably higher than or equal to 10% and lower than or equal to 30%.

In a manufacturing process of the transistor 500, the heat treatment is preferably performed with the surface of the oxide 530 exposed. The heat treatment is performed at higher than or equal to 100° C. and lower than or equal to 450° C., preferably higher than or equal to 350° C. and lower than or equal to 400° C., for example. Note that the heat treatment is performed in a nitrogen gas or inert gas atmosphere, or an atmosphere containing an oxidizing gas at 10 ppm or more, 1% or more, or 10% or more. For example, the heat treatment is preferably performed in an oxygen atmosphere. This provides oxygen to the oxide 530, and reduces oxygen vacancies ($V_O$). Alternatively, the heat treatment may be performed under reduced pressure. Alternatively, the heat treatment may be performed in such a manner that heat treatment is performed in a nitrogen gas or inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas or inert gas atmosphere.

Note that oxygen supplying treatment performed on the oxide 530 can promote a reaction in which oxygen vacancies in the oxide 530 are filled with supplied oxygen, i.e., a reaction of "$V_O+O \rightarrow null$". Furthermore, hydrogen remaining in the oxide 530 reacts with supplied oxygen, so that the hydrogen can be removed as $H_2O$ (dehydration). This can inhibit recombination of hydrogen remaining in the oxide 530 with oxygen vacancies and formation of $V_OH$.

In addition, in the case where the insulator 524 includes an excess-oxygen region, it is preferable that the insulator 522 have a function of inhibiting diffusion of oxygen (e.g., an oxygen atom, an oxygen molecule, or the like) (oxygen is less likely to pass).

When the insulator 522 has a function of inhibiting diffusion of oxygen or impurities, oxygen contained in the oxide 530 is not diffused into the insulator 520 side, which is preferable. Furthermore, the conductor 503 can be inhibited from reacting with oxygen contained in the insulator 524 or the oxide 530.

For the insulator 522, a single layer or stacked layers of an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate ($SrTiO_3$), or $(Ba,Sr)TiO_3$ (BST) are preferably used, for example. As miniaturization and high integration of transistors progress, a problem such as leakage current might arise because of a thinner gate insulating film. When a high-k material is used for an insulator functioning as the gate insulating film, a gate potential during transistor operation can be reduced while the physical thickness is maintained.

It is particularly preferable to use an insulator containing an oxide of one or both of aluminum and hafnium, which is an insulating material having a function of inhibiting diffusion of impurities, oxygen, and the like (through which oxygen is less likely to pass). Aluminum oxide, hafnium oxide, an oxide containing aluminum and hafnium (hafnium aluminate), or the like is preferably used as the insulator containing an oxide of one or both of aluminum and hafnium. In the case where the insulator 522 is formed using such a material, the insulator 522 functions as a layer that inhibits release of oxygen from the oxide 530 and mixing of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. The insulator over which silicon oxide, silicon oxynitride, or silicon nitride is stacked may be used.

In addition, it is preferable that the insulator 520 be thermally stable. For example, silicon oxide and silicon oxynitride are suitable because they are thermally stable. Furthermore, the combination of an insulator that is a high-k material and silicon oxide or silicon oxynitride enables the insulator 520 and an insulator 526 to have a stacked-layer structure that has thermal stability and a high relative permittivity.

Note that the transistor 500 in FIG. 9A and FIG. 9B includes the insulator 520, the insulator 522, and the insulator 524 as the second gate insulating film having a three-layer structure; however, the second gate insulating film may have a single-layer structure, a two-layer structure, or a stacked-layer structure of four or more layers. In such cases, without limitation to a stacked-layer structure formed of the same material, a stacked-layer structure formed of different materials may be employed.

In the transistor 500, an oxide semiconductor is preferably used for the oxide 530 including the channel formation region. For example, for the oxide 530, an oxide semiconductor such as an In-M-Zn oxide (the element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used. In particular, the In-M-Zn oxide which can be used for the oxide 530 is preferably a CAAC-OS (c-axis aligned crystalline oxide semiconductor) or a CAC-OS (Cloud-Aligned Composite oxide semiconductor). The CAAC-OS refers to an oxide having a CAAC structure, and the CAAC structure is a crystal structure in which a plurality of IGZO nanocrystals have c-axis alignment and are connected in the a-b plane direction without alignment. The CAC-OS is, for example, a composition of a material in which elements that constitute an oxide semiconductor are unevenly distributed to have a size of greater than or equal to 0.5 nm and less than or equal to 10 nm, preferably greater than or equal to 1 nm and less than or equal to 2 nm, or a similar size. Note that in the following description, a state in which one or more metal elements are unevenly distributed and regions including the metal element(s) are mixed to have a size of greater than or equal to 0.5 nm and less than or equal to 10 nm, preferably greater than or equal to 1 nm and less than or equal to 2 nm, or a similar size in an oxide semiconductor is referred to as a mosaic pattern or a patch-like pattern. Furthermore, as the oxide 530, an In—Ga oxide or an In—Zn oxide may be used.

An oxide semiconductor with a low carrier concentration is preferably used for the transistor 500. In the case where the carrier concentration of an oxide semiconductor is reduced, the impurity concentration in the oxide semiconductor is reduced to reduce the density of defect states. In this specification and the like, a state with a low impurity concentration and a low density of defect states is referred to as a highly purified intrinsic or substantially highly purified intrinsic state. As examples of the impurities in the oxide semiconductor, hydrogen, nitrogen, alkali metal, alkaline earth metal, iron, nickel, silicon, and the like are given.

In particular, hydrogen contained in the oxide semiconductor reacts with oxygen bonded to a metal atom to be water, and thus sometimes forms an oxygen vacancy (also referred to as $V_O$) in the oxide semiconductor. In the case where hydrogen enters an oxygen vacancy in the oxide semiconductor, the oxygen vacancy and the hydrogen are bonded to each other to form $V_OH$ in some cases. The $V_OH$ serves as a donor and an electron that is a carrier is generated in some cases. In other cases, bonding of part of hydrogen to oxygen bonded to a metal atom generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of a transistor. In one embodiment of the present invention, $V_OH$ in the oxide 530 is preferably reduced as much as possible so that the oxide 530 becomes a highly purified intrinsic or substantially highly purified intrinsic oxide. It is important to remove impurities such as moisture and hydrogen in an oxide semiconductor (sometimes described as dehydration or dehydrogenation treatment) and to supply oxygen to the oxide semiconductor to fill oxygen vacancies (sometimes described as oxygen supplying treatment) to obtain an oxide semiconductor whose VoH is sufficiently reduced. When an oxide semiconductor with sufficiently reduced impurities such as VoH is used for a channel formation region of a transistor, the transistor can have stable electrical characteristics.

A defect in which hydrogen has entered an oxygen vacancy can function as a donor of the oxide semiconductor. However, it is difficult to evaluate the defects quantitatively. Thus, the oxide semiconductor is sometimes evaluated by not its donor concentration but its carrier concentration. Therefore, in this specification and the like, the carrier concentration assuming the state where an electric field is not applied is sometimes used, instead of the donor concentration, as the parameter of the oxide semiconductor. That is, "carrier concentration" in this specification and the like can be replaced with "donor concentration" in some cases.

Therefore, when an oxide semiconductor is used for the oxide 530, hydrogen in the oxide semiconductor is prefer-ably reduced as much as possible. Specifically, the hydrogen concentration of the oxide semiconductor, which is measured by secondary ion mass spectrometry (SIMS), is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When an oxide semiconductor with sufficiently reduced impurities such as hydrogen is used for a channel formation region of a transistor, the transistor can have stable electrical characteristics.

In the case where an oxide semiconductor is used for the oxide 530, the carrier concentration of the oxide semiconductor in the channel formation region is preferably lower than or equal to $1\times10^{18}$ cm$^{-3}$, further preferably lower than $1\times10^{17}$ cm$^{-3}$, still further preferably lower than $1\times10^{16}$ cm$^{-3}$, yet further preferably lower than $1\times10^{13}$ cm$^{-3}$, and yet still further preferably lower than $1\times10^{12}$ cm$^{-3}$. Note that the lower limit of the carrier concentration of the oxide semiconductor in the channel formation region is not particularly limited and can be, for example, $1\times10^{-9}$ cm$^{-3}$.

When an oxide semiconductor is used for the oxide 530, contact between the conductor 542 (the conductor 542a and the conductor 542b) and the oxide 530 may make oxygen in the oxide 530 diffuse into the conductor 542, resulting in oxidation of the conductor 542. It is highly probable that oxidation of the conductor 542 lowers the conductivity of the conductor 542. Note that diffusion of oxygen in the oxide 530 into the conductor 542 can be rephrased as absorption of oxygen in the oxide 530 by the conductor 542.

When oxygen in the oxide 530 is diffused into the conductor 542 (the conductor 542a and the conductor 542b), another layer is sometimes formed between the conductor 542a and the oxide 530b, and between the conductor 542b and the oxide 530b. The layer contains more oxygen than the conductor 542 does, and thus the layer presumably has an insulating property. In this case, a three-layer structure of the conductor 542, the layer, and the oxide 530b can be regarded as a three-layer structure formed of metal-insulator-semiconductor, which is referred to as an MIS (Metal-Insulator-Semiconductor) structure or a diode junction structure having an MIS structure as its main part in some cases.

The above layer is not necessarily formed between the conductor 542 and the oxide 530b; for example, the layer may be formed between the conductor 542 and the oxide 530c, or between the conductor 542 and the oxide 530b and between the conductor 542 and the oxide 530c.

The oxide semiconductor functioning as the channel formation region in the oxide 530 has a band gap of preferably 2 eV or higher, further preferably 2.5 eV or higher. With the use of an oxide semiconductor having such a wide band gap, the off-state current of the transistor can be reduced.

When the oxide 530 includes the oxide 530a under the oxide 530b, it is possible to inhibit diffusion of impurities into the oxide 530b from the components formed below the oxide 530a. Moreover, including the oxide 530c over the oxide 530b makes it possible to inhibit diffusion of impurities into the oxide 530b from the components formed above the oxide 530c.

Note that the oxide 530 preferably has a stacked-layer structure of oxides that differ in the atomic ratio of metal atoms. Specifically, the atomic ratio of the element M to the constituent elements in the oxide semiconductor used for the oxide 530a is preferably higher than the atomic ratio of the element M to the constituent elements in the oxide semiconductor used for the oxide 530b. In addition, the atomic ratio of the element M to In in the oxide semiconductor used as the oxide 530a is preferably higher than the atomic ratio of the element M to In in the oxide semiconductor used for the oxide 530b. Furthermore, the atomic ratio of In to the element M in the oxide semiconductor used for the oxide 530b is preferably higher than the atomic ratio of In to the element M in the oxide semiconductor used for the oxide 530a. Moreover, an oxide semiconductor that can be used for the oxide 530a or the oxide 530b can be used for the oxide 530c.

In addition, the energy of the conduction band minimum of each of the oxide 530a and the oxide 530c is preferably higher than the energy of the conduction band minimum of the oxide 530b. In other words, the electron affinity of each of the oxide 530a and the oxide 530c is preferably smaller than the electron affinity of the oxide 530b.

Here, the energy level of the conduction band minimum gradually changes at junction portions of the oxide 530a, the oxide 530b, and the oxide 530c. In other words, the energy level of the conduction band minimum at the junction portions of the oxide 530a, the oxide 530b, and the oxide 530c continuously changes or is continuously connected. To change the energy level gradually, the densities of defect states in mixed layers formed at an interface between the oxide 530a and the oxide 530b and an interface between the oxide 530b and the oxide 530c is preferably made low.

Specifically, when the oxide 530a and the oxide 530b or the oxide 530b and the oxide 530c contain a common element (as a main component) in addition to oxygen, a mixed layer with a low density of defect states can be formed. For example, in the case where the oxide 530b is an In—Ga—Zn oxide, an In—Ga—Zn oxide, a Ga—Zn oxide, gallium oxide, or the like is preferably used for the oxide 530a and the oxide 530c.

At this time, the oxide 530b serves as a main carrier path. When the oxide 530a and the oxide 530c have the above structures, the densities of defect states at the interface between the oxide 530a and the oxide 530b and the interface between the oxide 530b and the oxide 530c can be made low. Thus, the influence of interface scattering on carrier conduction is small, and the transistor 500 can have a high on-state current.

The conductor 542a and the conductor 542b functioning as the source electrode and the drain electrode are provided over the oxide 530b. For the conductor 542a and conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing the above metal element; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. In addition, tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable materials because they are oxidation-resistant conductive materials or materials that retain their conductivity even after absorbing oxygen. Furthermore, a metal nitride film of tantalum nitride or the like is preferable because it has a barrier property against hydrogen or oxygen.

In addition, although the conductor 542a and the conductor 542b each having a single-layer structure are shown in FIG. 9, a stacked-layer structure of two or more layers may be employed. For example, it is preferable to stack a tantalum nitride film and a tungsten film. Alternatively, a titanium film and an aluminum film may be stacked. Alternatively, a two-layer structure where an aluminum film is stacked over a tungsten film, a two-layer structure where a copper film is stacked over a copper-magnesium-aluminum alloy film, a two-layer structure where a copper film is stacked over a titanium film, or a two-layer structure where a copper film is stacked over a tungsten film may be employed.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As shown in FIG. 9A, a region 543a and a region 543b are sometimes formed as low-resistance regions in the oxide 530 at and around the interface with the conductor 542a (the conductor 542b). In that case, the region 543a functions as one of a source region and a drain region, and the region 543b functions as the other of the source region and the drain region. Furthermore, the channel formation region is formed in a region between the region 543a and the region 543b.

When the conductor 542a (the conductor 542b) is provided to be in contact with the oxide 530, the oxygen concentration in the region 543a (the region 543b) sometimes decreases. In addition, a metal compound layer that contains the metal contained in the conductor 542a (the conductor 542b) and the component of the oxide 530 is sometimes formed in the region 543a (the region 543b). In such a case, the carrier concentration of the region 543a (the region 543b) increases, and the region 543a (the region 543b) becomes a low-resistance region.

The insulator 544 is provided to cover the conductor 542a and the conductor 542b and inhibits oxidation of the conductor 542a and the conductor 542b. At this time, the insulator 544 may be provided to cover a side surface of the oxide 530 and to be in contact with the insulator 524.

An oxide semiconductor containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. Alternatively, silicon nitride oxide, silicon nitride, or the like can be used for the insulator 544.

It is particularly preferable to use an insulator containing an oxide of one or both of aluminum and hafnium, such as aluminum oxide, hafnium oxide, or an oxide containing aluminum and hafnium (hafnium aluminate), for the insulator 544. In particular, hafnium aluminate has higher heat resistance than hafnium oxide. Therefore, hafnium aluminate is preferable because it is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is appropriately set in consideration of required transistor characteristics.

When the insulator 544 is included, diffusion of impurities such as water and hydrogen contained in the insulator 580 into the oxide 530b through the oxide 530c and the insulator 550 can be inhibited. Furthermore, oxidation of the conductor 560 due to excess oxygen contained in the insulator 580 can be inhibited.

The insulator 550 functions as a first gate insulating film. The insulator 550 is preferably positioned in contact with an inner side (a top surface and a side surface) of the oxide 530c. Like the insulator 524, the insulator 550 is preferably formed using an insulator that contains excess oxygen and releases oxygen by heating.

Specifically, silicon oxide containing excess oxygen, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

When an insulator that releases oxygen by heating is provided for the insulator 550 in contact with the top surface of the oxide 530c, oxygen can be effectively supplied from the insulator 550 to the channel formation region of the oxide 530b through the oxide 530c. Furthermore, as in the insulator 524, the concentration of impurities such as water and hydrogen in the insulator 550 is preferably lowered. The thickness of the insulator 550 is preferably greater than or equal to 1 nm and less than or equal to 20 nm.

Furthermore, to efficiently supply excess oxygen contained in the insulator 550 to the oxide 530, a metal oxide may be provided between the insulator 550 and the conductor 560. The metal oxide preferably inhibits diffusion of oxygen from the insulator 550 to the conductor 560. Providing the metal oxide that inhibits diffusion of oxygen inhibits diffusion of excess oxygen from the insulator 550 to the conductor 560. That is, a reduction in the amount of excess oxygen supplied to the oxide 530 can be inhibited. Moreover, oxidation of the conductor 560 due to excess oxygen can be inhibited. For the metal oxide, a material that can be used for the insulator 544 is used.

Note that the insulator 550 may have a stacked-layer structure like the second gate insulating film. As miniaturization and high integration of transistors progress, a problem such as leakage current might arise because of a thinner gate insulating film. For that reason, when the insulator functioning as the gate insulating film has a stacked-layer structure of a high-k material and a thermally stable material, a gate potential during transistor operation can be reduced while the physical thickness is maintained. Furthermore, the stacked-layer structure can be thermally stable and have a high relative permittivity.

Although the conductor 560 functioning as the first gate electrode has a two-layer structure in FIG. 9A and FIG. 9B, the conductor 560 may have a single-layer structure or a stacked-layer structure of three or more layers.

For the conductor 560a, it is preferable to use a conductive material having a function of inhibiting diffusion of impurities such as a hydrogen atom, a hydrogen molecule, a water molecule, a nitrogen atom, a nitrogen molecule, a nitrogen oxide molecule ($N_2O$, $NO$, $NO_2$, and the like), and a copper atom. Alternatively, it is preferable to use a conductive material having a function of inhibiting diffusion of oxygen (e.g., at least one of an oxygen atom, an oxygen molecule, and the like). When the conductor 560a has a function of inhibiting diffusion of oxygen, it is possible to inhibit a reduction in conductivity of the conductor 560b due to oxidation caused by oxygen contained in the insulator 550. As a conductive material having a function of inhibiting diffusion of oxygen, for example, tantalum, tantalum nitride, ruthenium, ruthenium oxide, or the like is preferably used. For the conductor 560a, the oxide semiconductor that can be used for the oxide 530 can be used. In that case, when the conductor 560b is deposited by a sputtering method, the conductor 560a can have a reduced electrical resistance value to be a conductor. Such a conductor can be referred to as an OC (Oxide Conductor) electrode.

In addition, a conductive material containing tungsten, copper, or aluminum as its main component is preferably used for the conductor 560b. Furthermore, the conductor 560b also functions as a wiring and thus a conductor having high conductivity is preferably used for the conductor 560b. For example, a conductive material containing tungsten, copper, or aluminum as its main component can be used. Moreover, the conductor 560b may have a stacked-layer structure, for example, a stacked-layer structure of the above conductive material and titanium or titanium nitride.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, resin, or the like. In particular, silicon oxide and silicon oxynitride are preferable because they are thermally stable. In particular, silicon oxide and porous silicon oxide are preferable because an excess-oxygen region can be easily formed in a later step.

The insulator 580 preferably includes an excess-oxygen region. When the insulator 580 that releases oxygen by heating is provided in contact with the oxide 530c, oxygen in the insulator 580 can be efficiently supplied to the oxide 530 through the oxide 530c. Note that the concentration of impurities such as water or hydrogen in the insulator 580 is preferably reduced.

The opening of the insulator 580 is formed to overlap with the region between the conductor 542a and the conductor 542b. Accordingly, the conductor 560 is formed to be embedded in the opening of the insulator 580 and the region between the conductor 542a and the conductor 542b.

The gate length needs to be short for miniaturization of the semiconductor device, but it is necessary to prevent a reduction in conductivity of the conductor 560. When the conductor 560 is made thick to achieve this, the conductor 560 might have a shape with a high aspect ratio. In this embodiment, the conductor 560 is provided to be embedded in the opening of the insulator 580; thus, even when the conductor 560 has a shape with a high aspect ratio, the conductor 560 can be formed without collapsing during the process.

The insulator 574 is preferably provided in contact with a top surface of the insulator 580, a top surface of the conductor 560, and a top surface of the insulator 550. When the insulator 574 is deposited by a sputtering method, excess-oxygen regions can be provided in the insulator 550 and the insulator 580. Accordingly, oxygen can be supplied from the excess-oxygen regions to the oxide 530.

For example, an oxide semiconductor containing one kind or two or more kinds selected from hafnium, aluminum, gallium, yttrium, zirconium, tungsten, titanium, tantalum, nickel, germanium, magnesium, and the like can be used for the insulator 574.

In particular, aluminum oxide has a high barrier property, and even a thin aluminum oxide film having a thickness of greater than or equal to 0.5 nm and less than or equal to 3.0 nm can inhibit diffusion of hydrogen and nitrogen. Accordingly, aluminum oxide deposited by a sputtering method serves as an oxygen supply source and can also have a function of a barrier film against impurities such as hydrogen.

Note that after the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 514 or the insulator 522 and the formation of the insulator having a high barrier property in contact with the insulator 514 or the insulator 522 are suitable because these formation steps can also serve as some of the manufacturing steps of the transistor 500. The insulator having a high barrier property against hydrogen or water is formed using a material similar to that for the insulator 522, for example.

In addition, an insulator 581 functioning as an interlayer film is preferably provided over the insulator 574. As in the insulator 524 or the like, the concentration of impurities such as water or hydrogen in the insulator 581 is preferably reduced.

Furthermore, a conductor 540a and a conductor 540b are positioned in openings formed in the insulator 581, the insulator 574, the insulator 580, and the insulator 544. The conductor 540a and the conductor 540b are provided to face each other with the conductor 560 therebetween. The conductor 540a and the conductor 540b each have a structure similar to that of a conductor 546 and a conductor 548 that will be described later.

An insulator 582 is provided over the insulator 581. A substance having a barrier property against oxygen or hydrogen is preferably used for the insulator 582. Therefore, a material similar to that for the insulator 514 can be used for the insulator 582. For the insulator 582, a metal oxide such as aluminum oxide, hafnium oxide, or tantalum oxide is preferably used, for example.

In particular, aluminum oxide has an excellent blocking effect that prevents the passage of both oxygen and impurities such as hydrogen and moisture which are factors of a change in electrical characteristics of the transistor. Accordingly, aluminum oxide can prevent mixing of impurities such as hydrogen and moisture into the transistor 500 in a manufacturing process and after manufacturing of the transistor. In addition, release of oxygen from the oxide included in the transistor 500 can be inhibited. Therefore, aluminum oxide is suitably used for a protective film of the transistor 500.

In addition, an insulator 586 is provided over the insulator 582. For the insulator 586, a material similar to that for the insulator 320 can be used. Furthermore, when a material with a comparatively low dielectric constant is used for these insulators, parasitic capacitance generated between wirings can be reduced. A silicon oxide film, a silicon oxynitride film, or the like can be used for the insulator 586, for example.

Furthermore, the conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have functions of plugs or wirings that are connected to the capacitor 600, the transistor 500, or the transistor 300. The conductor 546 and the conductor 548 can be provided using materials similar to those for the conductor 328 and the conductor 330.

Next, the capacitor 600 is provided above the transistor 500. The capacitor 600 includes a conductor 610, a conductor 620, and an insulator 630.

In addition, a conductor 612 may be provided over the conductor 546 and the conductor 548. The conductor 612 has a function of a plug or a wiring that is connected to the transistor 500. The conductor 610 has a function of an electrode of the capacitor 600. Note that the conductor 612 and the conductor 610 can be formed at the same time.

As the conductor 612 and the conductor 610, a metal film containing an element selected from molybdenum, titanium, tantalum, tungsten, aluminum, copper, chromium, neodymium, and scandium; a metal nitride film containing the above element as its component (a tantalum nitride film, a titanium nitride film, a molybdenum nitride film, or a tungsten nitride film); or the like can be used. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in FIG. 7; however, the structure is not limited thereto, and a stacked-layer structure of two or more layers may be employed. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that a conductive material such as a metal material, an alloy material, or a metal oxide material can be used for the conductor 620. It is preferable to use a high-melting-point material that has both heat resistance and conductivity, such as tungsten or molybdenum, and it is particularly preferable to use tungsten. In addition, in the case where the conductor 620 is formed concurrently with another component such as a conductor, Cu (copper), Al (aluminum), or the like, which is a low-resistance metal material, is used.

An insulator 640 is provided over the conductor 620 and the insulator 630. The insulator 640 can be provided using a material similar to that for the insulator 320. In addition, the insulator 640 may function as a planarization film that covers an uneven shape therebelow.

Using the structure, a semiconductor device using a transistor including an oxide semiconductor can be miniaturized or highly integrated.

Embodiment 5

Figure 10:
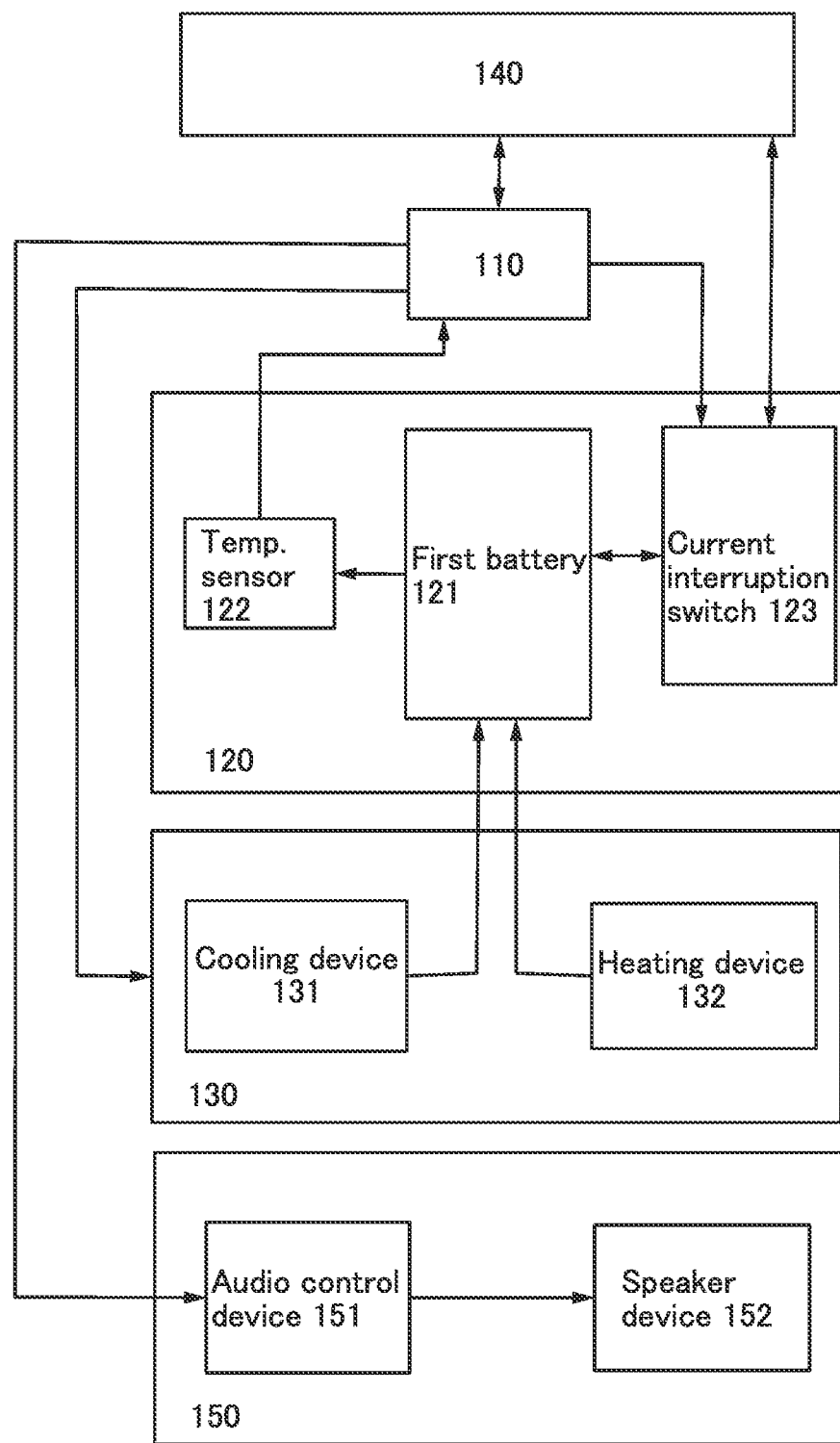
FIG. 10 is a block diagram illustrating one embodiment of the present invention.

In this embodiment, an example is illustrated in FIG. 10 in which in addition to the heating device 132 and the cooling device 131, a user is warned with an alarm or the like. FIG. 10 is a block diagram and only partly different from FIG. 1; thus, the description of the same portion is omitted here.

In an electric vehicle or the like, in the case where the temperature of the secondary battery rises or falls and is likely to be out of the temperature range in which normal operation can be performed, a user is notified with a warning alarm that danger of occurrence of system abnormality of the EV is approaching. With a signal from the abnormality detection system 110, the warning alarm can be given from the audio control device 151 of an audio device 150 through a speaker device 152.

In addition, in the case where the temperature of the secondary battery rises or falls and is not within the temperature range in which normal operation can be performed, a user can be notified with a warning alarm that danger of occurrence of system abnormality of the EV is approaching.

The audio device 150 is not limited to warning by a sound, one or a combination of a warning by vibration and warning by lighting may be employed.

This embodiment can be freely combined with any of the other embodiments.

Embodiment 6

Figure 5:
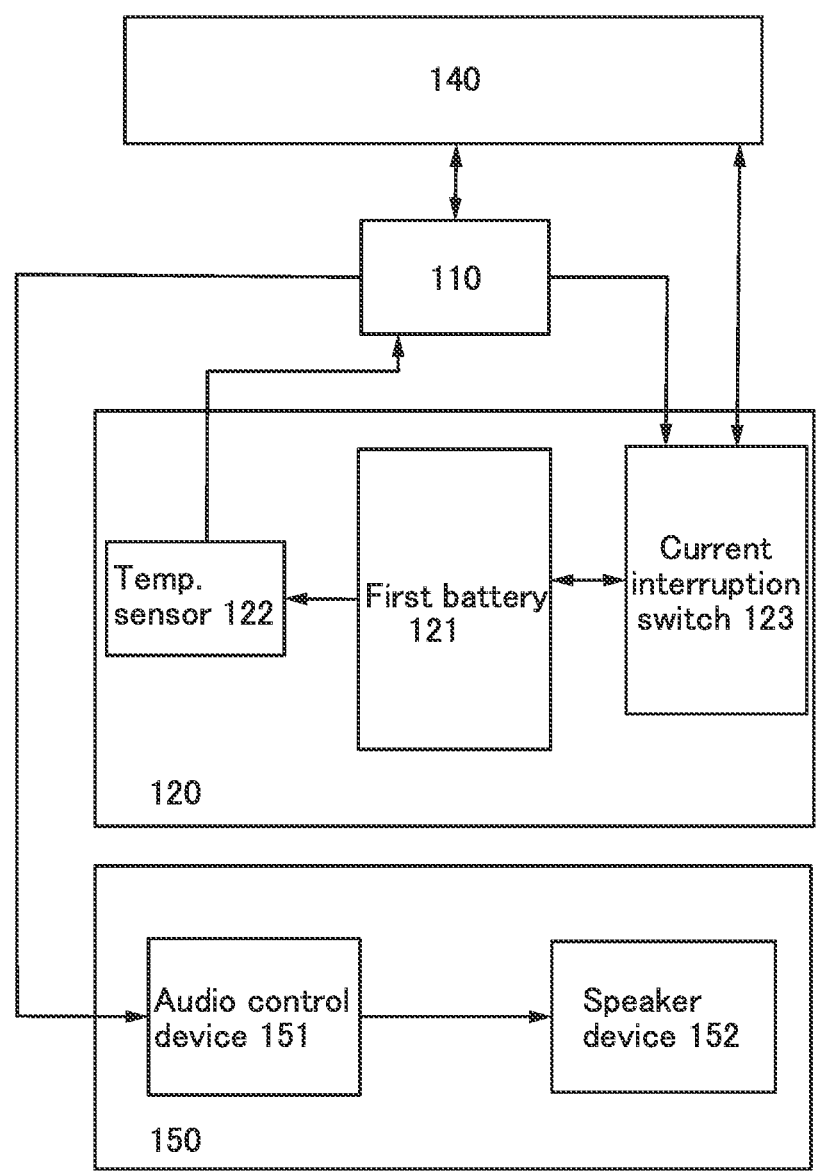
FIG. 5 is a block diagram illustrating one embodiment of the present invention.

FIG. 5 is an overall block diagram of an abnormality detection system of a secondary battery (hereinafter also referred to as a battery) whose temperature is to be controlled.

In FIG. 5, the vehicle 140 is another portion of the electric vehicle and includes a control circuit other than a charge control circuit, an air conditioning system, and the like.

The abnormality detection system 110 includes at least a charge control circuit and a memory means.

A temperature of the first battery 121 is measured by the temperature sensor 122 and the temperature is controlled by the abnormality detection system 110. When the temperature increases and is likely to exceed an allowable range in charging, the audio device 150 is started to give a warning to a user, as well as a control signal is input to the current interruption switch 123 from the abnormality detection system 110 and charging is stopped.

As illustrated in FIG. 4A, the cooling device 131 and the heating device 132 are provided close to the first battery 121. The cooling device 131 and the heating device 132 can be referred to as the temperature control device 130 of the first battery 121. When the temperature increases and is likely to exceed an allowable range, a command signal is input to the cooling device 131 from the abnormality detection system 110 and the temperature of the first battery 121 is lowered. When the temperature lowers and is likely to fall out of the allowable range, a command signal is input to the heating device 132 from the abnormality detection system 110 and the temperature of the first battery 121 is increased. The temperature control device 130 of the secondary battery includes the cooling device 131 and the heating device 132.

Note that the abnormality detection system 110 specifically refers to a group of a plurality of ICs (e.g., CPUs) provided over a printed circuit board, for example.

The abnormality detection system 110 controls the temperature of the battery by analog signal processing or digital signal processing.

In the case where temperature sensing is processed by analog signal processing, the temperature sensing 111 can sense a temperature state of the battery using an output signal (temperature information) of the temperature sensor that is an analog signal as it is, as illustrated in FIG. 2A.

In the case where temperature sensing is processed by digital signal processing, the ADC 113 converts the battery temperature (analog signal) into a digital signal and outputs the digital signal, as illustrated in FIG. 2B.

The temperature sensing 111 can generate a pulse signal for on-off control by using hysteresis comparators such as those illustrated in FIG. 3.

The case where the abnormality detection system is used for a vehicle is described with reference to FIG. 4 that includes the block diagram described in Embodiment 1. Whereas FIG. 4A illustrates the temperature control device 130, a structure may be employed in which a temperature control mechanism of the first battery 121 is not provided and only a warning alarm is output from the speaker device 152 in the case of exceeding the temperature range.

As the operation of the audio device 150 to give a warning alarm, when a potential corresponding to the battery temperature falls below the low-temperature setting (low), a warning control signal (low temperature) that is an output of the hysteresis comparator is on. For example, in the case where a pulse signal that becomes on at regular intervals is input, the volume of the warning alarm is adjusted in accordance with the cycle. The short cycle makes the volume large and the long cycle makes the volume small. If the potential corresponding to the battery temperature exceeds the low-temperature setting (high), the warning control signal (low temperature) that is an output of the hysteresis comparator is off and the audio device 150 stops generating the warning alarm.

The audio device 150 may employ a system structure utilizing a horn of the electric vehicle. In order to appeal to the human senses, not only an audio output (hearing stimulus) but also a light output (visual stimulus) utilizing a light-emitting element (e.g., headlight) of the electric vehicle may be incorporated into the system.

With the abnormality detection system of a secondary battery disclosed in this specification, temperature abnormality of the secondary battery is detected and a user is warned to be cautious; thus, a grave situation can be avoided.

This embodiment can be implemented in combination with the structures described in the other embodiments as appropriate.

REFERENCE NUMERALS

110: abnormality detection system, 111: temperature sensing, 112: protective circuit, 113: ADC, 114: temperature sensing arithmetic circuit, 120: battery module, 121: battery, 122: temperature sensor, 123: current interruption switch, 130: temperature control device, 131: cooling device, 132: heating device, 140: vehicle, 150: audio device, 151: audio control device, 152: speaker device, 202: battery controller, 203: motor controller, 204: motor, 205: gear, 206: DCDC circuit, 210: DCDC circuit, 211: battery, 212: inverter, 216: wheel, 300: transistor, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 410: memory element, 420: memory element, 430: memory element, 440: memory element, 450: memory element, 460: memory element, 470: memory element, 500: transistor, 503: conductor, 503*a*: conductor, 503*b*: conductor, 505: conductor, 510: insulator, 512: insulator, 514: insulator, 516: insulator, 518: conductor, 520: insulator, 522: insulator, 524: insulator, 526: insulator, 530: oxide, 530*a*: oxide, 530*b*: oxide, 530*c*: oxide, 540*a*: conductor, 540*b*: conductor, 542: conductor, 542*a*: conductor, 542*b*: conductor, 543*a*: region, 543*b*: region, 544: insulator, 546: conductor, 548: conductor, 550: insulator, 560: conductor, 560*a*: conductor, 560*b*: conductor, 574: insulator, 580: insulator, 581: insulator, 582: insulator, 586: insulator, 600: capacitor, 601: positive electrode cap, 602: battery can, 603: positive electrode terminal, 604: positive electrode, 605: separator, 606: negative electrode, 607: negative electrode terminal, 608: insulating plate, 609: insulating plate, 610: conductor, 611: PTC element, 612: conductor, 613: conductive plate, 614: conductive plate, 616: secondary battery, 617: safety valve mechanism, 620: conductor, 630: insulator, 640: insulator, 1400: storage battery, 1402: positive electrode, 1404: negative electrode, 1406: electrolyte solution, 1408: separator, 8021: charging apparatus, 8022: cable, 8024: secondary battery, 8400: automobile, 8401: headlight, 8406: electric motor, 8500: automobile, 8600: scooter, 8601: side mirror, 8602: secondary battery, 8603: direction indicator, 8604: under-seat storage.

The invention claimed is:

1. A charge control circuit of a secondary battery, comprising:
   a temperature sensor for sensing a temperature of the secondary battery;
   a first temperature comparison circuit and a second temperature comparison circuit provided with an analog signal from the temperature sensor to generate a pulse signal;
   a heating device of the secondary battery which operates in two temperature ranges set by the first temperature comparison circuit;
   a cooling device of the secondary battery which operates in two temperature ranges set by the second temperature comparison circuit; and
   a memory means which is configured to hold an analog signal,
   wherein the memory means comprises a transistor using an oxide semiconductor for a semiconductor layer, a capacitor, a first wiring, a second wiring, and a third wiring,
   wherein the transistor comprises a first gate and a second gate,
   wherein a first terminal of the transistor is electrically connected to the first wiring,
   wherein a second terminal of the transistor is electrically connected to a first terminal of the capacitor,
   wherein the first gate of the transistor is electrically connected to the second wiring, and
   wherein the second gate of the transistor is electrically connected to the third wiring.

2. The charge control circuit of the secondary battery, according to claim 1, wherein the first temperature comparison circuit comprises a comparator having two threshold values.

3. The charge control circuit of the secondary battery, according to claim 1, wherein the charge control circuit of the secondary battery controls turning on and off of a switch for interrupting current for charging the secondary battery.

4. The charge control circuit of the secondary battery, according to claim 1, wherein the charge control circuit of the secondary battery is provided over a printed circuit board.

5. A charge control circuit of a secondary battery, comprising:
   a temperature sensor for sensing a temperature of the secondary battery;
   a temperature comparison circuit provided with an analog signal from the temperature sensor to generate a pulse signal;
   an audio device that operates in a temperature range set by the temperature comparison circuit; and
   a memory means which is configured to hold an analog signal,
   wherein the temperature comparison circuit comprises a comparator having two threshold values,
   wherein the memory means comprises a transistor using an oxide semiconductor for a semiconductor layer, a capacitor, a first wiring, a second wiring, and a third wiring,
   wherein the transistor comprises a first gate and a second gate,
   wherein a first terminal of the transistor is electrically connected to the first wiring,
   wherein a second terminal of the transistor is electrically connected to a first terminal of the capacitor,
   wherein the first gate of the transistor is electrically connected to the second wiring, and
   wherein the second gate of the transistor is electrically connected to the third wiring.

6. The charge control circuit of the secondary battery, according to claim 5, wherein the charge control circuit of the secondary battery is provided over a printed circuit board.

* * * * *